US012787570B2

(12) United States Patent
Kang et al.

(10) Patent No.: US 12,787,570 B2
(45) Date of Patent: Nov. 3, 2026

(54) BONDING STRUCTURE AND DISPLAY DEVICE HAVING THE SAME

(71) Applicant: Samsung Display Co., Ltd., Yongin-si (KR)

(72) Inventors: Eui Jeong Kang, Yongin-si (KR); Jeongmin Ban, Yongin-si (KR); Ikjun Hong, Yongin-si (KR); Minhee Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 689 days.

(21) Appl. No.: 18/296,019

(22) Filed: Apr. 5, 2023

(65) Prior Publication Data

US 2023/0329054 A1 Oct. 12, 2023

(30) Foreign Application Priority Data

Apr. 11, 2022 (KR) ........................ 10-2022-0044749

(51) Int. Cl.
*H10K 59/131* (2023.01)
*H10K 59/90* (2026.01)

(52) U.S. Cl.
CPC ........... *H10K 59/131* (2023.02); *H10K 59/90* (2023.02)

(58) Field of Classification Search
CPC ............................. H10K 59/131; H10K 59/90
See application file for complete search history.

(56) References Cited

U.S. PATENT DOCUMENTS

| | | | |
|---|---|---|---|
| 6,781,152 | B2 | 8/2004 | Yamazaki |
| 10,777,101 | B2 | 9/2020 | Park |
| 10,884,532 | B2 * | 1/2021 | Shin ........................ G06F 3/041 |
| 11,050,037 | B2 | 6/2021 | Tan |
| 11,054,687 | B2 * | 7/2021 | Ohno ................ G02F 1/133382 |
| 2004/0245924 | A1 | 12/2004 | Utsunomiya et al. |
| 2016/0113106 | A1 | 4/2016 | Kim |
| 2017/0288154 | A1 * | 10/2017 | Seo ...................... H10K 85/342 |
| 2019/0312095 | A1 * | 10/2019 | Park ..................... H05K 1/0256 |
| 2020/0108586 | A1 | 4/2020 | Ryu et al. |
| 2021/0159305 | A1 | 5/2021 | Seo et al. |
| 2021/0343951 | A1 | 11/2021 | Ju |
| 2022/0069001 | A1 | 3/2022 | Kang et al. |

(Continued)

FOREIGN PATENT DOCUMENTS

| | | | |
|---|---|---|---|
| JP | 2001-290439 | A | 10/2001 |
| KR | 10200040100913 | A | 12/2004 |
| KR | 1020190032589 | A | 3/2019 |

(Continued)

*Primary Examiner* — Benjamin Tzu-Hung Liu
(74) *Attorney, Agent, or Firm* — CANTOR COLBURN LLP

(57) ABSTRACT

A display device includes a display module including a pad region, a base layer in which a first open region corresponding to the pad region is defined, a pixel on the base layer, and a signal line which is on the base layer, electrically connected to the pixel and includes a pad portion corresponding to the first open region, a flexible circuit board electrically connected to the display module, at the pad region of the display module, a window facing the display module, an upper layer between the window and the display module, and a resin structure which bonds the flexible circuit board to the display module, at the pad region.

19 Claims, 18 Drawing Sheets

(56) References Cited

U.S. PATENT DOCUMENTS

| | | | |
|---|---|---|---|
| 2022/0093649 | A1 | 3/2022 | Kim et al. |
| 2022/0140062 | A1 | 5/2022 | Lee |

FOREIGN PATENT DOCUMENTS

| | | | |
|---|---|---|---|
| KR | 20190086603 | A | 7/2019 |
| KR | 20190128025 | A | 11/2019 |
| KR | 1020220030340 | A | 3/2022 |
| KR | 1020220059980 | A | 5/2022 |

* cited by examiner

BONDING STRUCTURE AND DISPLAY DEVICE HAVING THE SAME

This application claims priority to Korean Patent Application No. 10-2022-0044749, filed on Apr. 11, 2022, and all the benefits accruing therefrom under 35 U.S.C. § 119, the entire contents of which are hereby incorporated by reference.

BACKGROUND

(1) Field

The present disclosure herein relates to a display device, and more particularly, to a display device including a flexible circuit board.

(2) Description of the Related Art

Electronic devices, such as smartphones, tablet computers, notebook computers, vehicle navigation devices, and smart televisions, are developed. Such electronic devices are provided with display devices so as to provide information to outside the electronic devices, such as to a user of the electronic devices.

In order to satisfy a user experience (UX) and a user interface (UI), display devices with various shapes are developed. Among the display devices, flexible display devices have been actively developed.

SUMMARY

The present disclosure provides a display device having a reduced bezel region.

An embodiment of the invention provides a display device including a window including a bezel region and a transmission region, an upper film disposed below the window and overlapping the bezel region and the transmission region, a display module disposed below the upper film and including a pad region coupled to a lower surface of the upper film in the bezel region, a lower film disposed below the display module and exposing the pad region to outside the display module, a flexible circuit board disposed below the lower film and bonded to the pad region of the display module, and a resin structure which bonds the flexible circuit board to the display module. The display module includes a base layer in which a first open region corresponding to the pad region is defined, a pixel disposed on the base layer, and a signal line which includes a pad portion overlapping the first open region, is disposed on the base layer, and electrically connects the pixel and the flexible circuit board.

In an embodiment, the pad portion may be exposed to outside the base layer through the first open region.

In an embodiment, the display module may further include a shield electrode, and the pixel may include a transistor including a semiconductor pattern and a gate, and a light emitting element which is connected to the transistor. The shield electrode may be disposed below the semiconductor pattern and overlap the semiconductor pattern.

In an embodiment, the display module may further include a pad electrode disposed on the same layer as the shield electrode, overlapping the pad portion, and disposed below the pad portion. The pad electrode may be electrically connected to the pad portion and the flexible circuit board.

In an embodiment, the display module may further include a sub-base layer disposed below the signal line and disposed above the base layer, at least one inorganic layer disposed between the sub-base layer and the base layer, and a pad electrode disposed between the sub-base layer and the base layer. The pad electrode may be electrically connected to the pad portion and the flexible circuit board.

In an embodiment, the display module may further include a sub-base layer disposed below the signal line and disposed above the base layer, and at least one inorganic layer disposed between the sub-base layer and the base layer. The pad portion of the signal line may be disposed between the sub-base layer and the base layer.

In an embodiment, a second open region corresponding to the pad region may be defined in the lower film.

In an embodiment, a side surface of the display module, a side surface of the upper film, and a side surface of the lower film may be in contact with the resin structure.

In an embodiment, a side surface of the pad portion may be in contact with the resin structure.

In an embodiment, the display device may further include a cover panel disposed below the lower film, and a driving chip mounted on the flexible circuit board. A cavity may be defined in a lower surface of the cover panel, and the driving chip may be inserted into the cavity.

In an embodiment, the display module may further include an input sensor disposed on the base layer.

In an embodiment, the display module may further include an anti-reflection member disposed on the input sensor. The anti-reflection member may include a color filter that is disposed to correspond to the pixel.

In an embodiment of the invention, a display device may include a window including a bezel region and a transmission region, a display module disposed below the window and including a pad region overlapping the bezel region, an upper member disposed between the window and the display module and non-overlapping the pad region, a first resin structure disposed between the window and the display module to bond the window and the display module, and overlapping the pad region, a lower film disposed below the display module and exposing the pad region to outside the display module, a flexible circuit board disposed below the lower film and bonded to the pad region of the display module, and a second resin structure which bonds the flexible circuit board to the display module. The display module may include a base layer in which a first open region corresponding to the pad region is defined, a pixel disposed on the base layer, and a signal line including a pad portion which is disposed on the base layer, electrically connects the pixel and the flexible circuit board, and overlaps the first open region.

In an embodiment, the upper member may include an adhesive layer that bonds the window and the display module.

In an embodiment, the pad portion may be exposed to outside the base layer through the first open region.

In an embodiment, a second open region corresponding to the pad region may be defined in the lower film, and the flexible circuit board may be bonded to the pad region through the second open region.

In an embodiment, a side surface of the display module and a side surface of the lower film may be in contact with the second resin structure.

In an embodiment, a side surface of the pad portion may be in contact with the second resin structure.

In an embodiment, the display device may further include a sub-base layer disposed below the signal line and disposed above the base layer, at least one inorganic layer disposed between the sub-base layer and the base layer, and a pad electrode disposed between the sub-base layer and the base layer.

In an embodiment, the pad electrode may be electrically connected to the pad portion and the flexible circuit board.

In an embodiment, the display module may further include a sub-base layer disposed below the signal line and disposed above the base layer, and at least one inorganic layer disposed between the sub-base layer and the base layer. The pad portion of the signal line may be disposed between the sub-base layer and the base layer.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain the invention. In the drawings.

DETAILED DESCRIPTION

Figure 1:
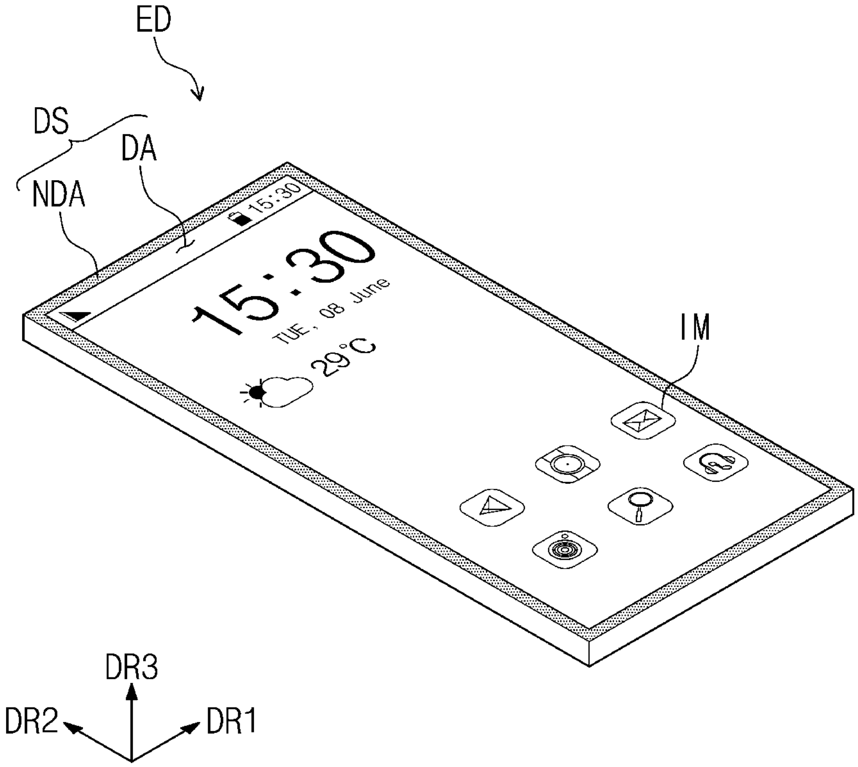
FIG. 1 is a perspective view of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that in this specification, when an element (or region, layer, section, etc.) is referred to as being related to another element such as being "on", "connected to" or "coupled to" another element, it can be disposed directly on, connected or coupled to the other element or a third intervening element may be disposed between the elements. In contrast, when an element (or region, layer, section, etc.) is referred to as being related to another element such as being "directly on", "directly connected to" or "directly coupled to" another element, no third intervening element is disposed between the elements. As being related "directly," elements may form an interface therebetween.

Like reference numbers or symbols refer to like elements throughout. As used herein, a reference number may indicate a singular element or a plurality of the element. For example, a reference number labeling a singular form of an element within the drawing figures may be used to reference a plurality of the singular element within the text of specification.

In addition, in the drawings, the thickness, the ratio, and the dimension of elements are exaggerated for effective description of the technical contents. The term "and/or" includes one or more combinations which may be defined by relevant elements.

It will be understood that, although the terms first, second, etc. may be used herein to describe various elements, these elements should not be limited by these terms. These terms are only used to distinguish one element from another element. For example, a first element could be termed a second element without departing from the teachings of the invention, and similarly, a second element could be termed a first element. As used herein, the singular forms are intended to include the plural forms as well, unless the context clearly indicates otherwise.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." In addition, the terms, such as "below", "beneath", "on" and "above", are used for explaining the relation of elements shown in the drawings. The terms are relative concept and are explained based on the direction shown in the drawing.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
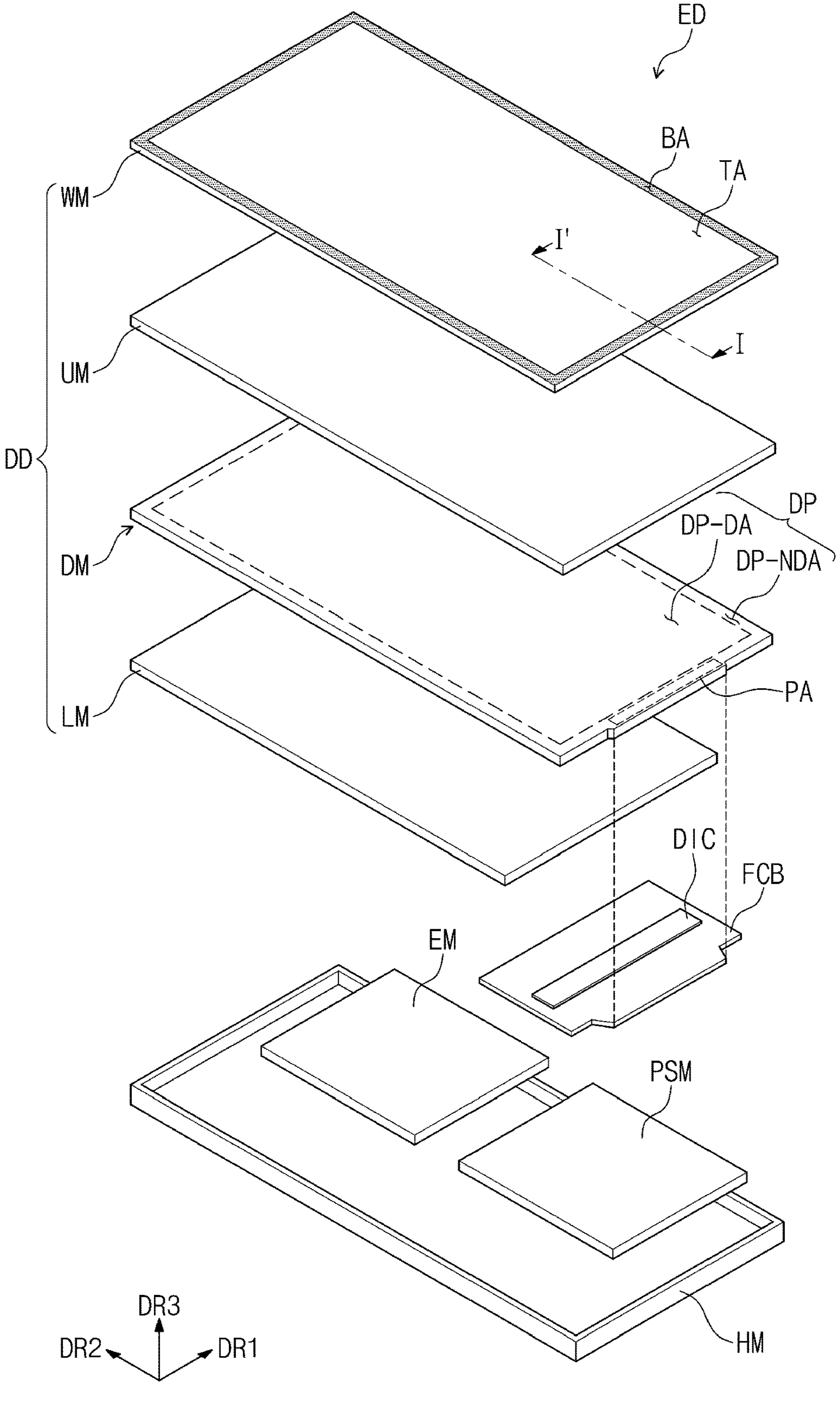
FIG. 2 is an exploded perspective view of the electronic device according to an embodiment of the invention.
Figure 3:
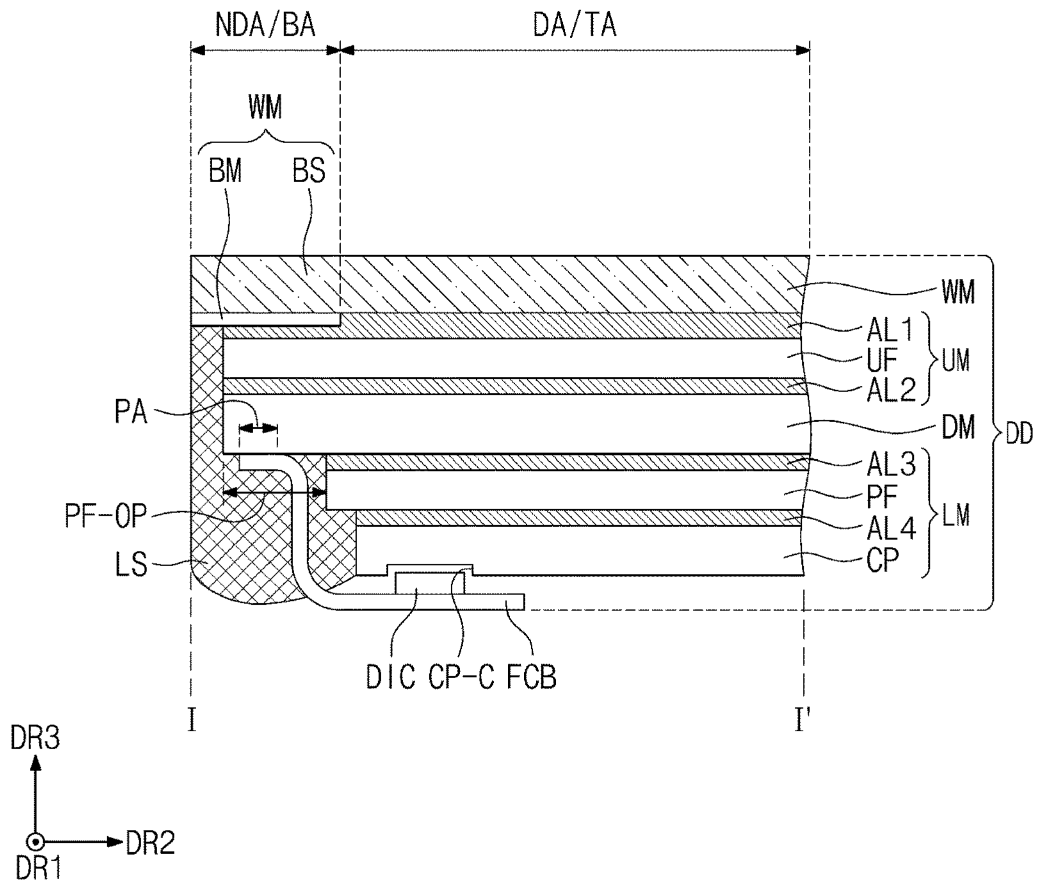
FIG. 3 is an enlarged cross-sectional view of the electronic device according to an embodiment of the invention.

FIG. 1 is a perspective view of an electronic device ED according to an embodiment of the invention. FIG. 2 is an exploded perspective view of the electronic device ED according to an embodiment of the invention. FIG. 3 is a cross-sectional view of the electronic device ED according to an embodiment of the invention.

Referring to FIG. 1, the electronic device ED according to an embodiment of the invention may include a display surface DS in a plane defined by a first direction DR1 and a second direction DR2 which crosses the first direction DR1. The electronic device ED may provide an image IM to the outside (e.g., outside of the electronic device ED, such as to a user), through the display surface DS.

The display surface DS may include a display region DA and a non-display region NDA which is adjacent to the display region DA. The display region DA may display the image IM, and the non-display region NDA may not display the image IM. The non-display region NDA may surround the display region DA in a plan view (e.g., a view of the plane defined by the first direction DR1 and the second direction DR2 crossing each other. However, an embodiment of the invention is not limited thereto, and the shape (e.g., a planar shape) of the display region DA and the shape (e.g., a planar shape) of the non-display region NDA may be changed.

Hereinafter, a direction substantially perpendicularly crossing a plane defined by the first direction DR1 and the second direction DR2 is defined as a third direction DR3. The third direction DR3 serves as a reference direction for distinguishing a front surface and a rear surface of each member. In the present disclosure, the term "on a plane" may be defined as being seen in the third direction DR3. Hereinafter, the first to third directions DR1, DR2 and DR3 are directions respectively indicated by first to third directional axes and denoted as like reference numbers or symbols. A thickness of the electronic device ED and various components or layers thereof may be defined along the third direction DR3 (e.g., a thickness direction).

In an embodiment of the invention, the electronic device ED may be a foldable electronic device that is capable of being folded with respect to a folding axis (e.g., is foldable about a folding axis). The folding axis may be parallel to the first direction DR1 or the second direction DR2, and a folding region at which the electronic device ED is foldable may be defined in a portion of the display region DA. The electronic device ED may be in-folded so that portions of the display region DA face each other, or may be out-folded so that portions of the display region DA face away from each other. Various components and/or layers of the electronic device ED may be foldable together with each other, without being limited thereto.

As illustrated in FIG. 2, the electronic device ED may include a display device DD, an electronic module EM, a power supply module PSM, and a housing HM. FIG. 2 is a schematic view illustrating the electronic device ED, and the electronic device ED may further include a mechanism structure for controlling an operation (for example, folding or rolling) of the display device DD.

The display device DD generates an image IM and detects an external input. The display device DD includes a window WM, an upper member UM (e.g., an upper layer), a display module DM, a lower member LM (e.g., a lower layer), a flexible circuit board FCB, and a driving chip DIC. The upper member UM includes members disposed above the display module DM, and the lower member LM includes members disposed below the display module DM, along the thickness direction.

The window WM provides (or defines) a front surface of the electronic device ED. The window WM includes a transmission region TA and a bezel region BA. The display region DA and the non-display region NDA of the display surface DS illustrated in FIG. 1 are defined by the transmission region TA and the bezel region BA. The transmission region TA is a region through which an image IM passes, and the bezel region BA is a region which covers a structure/member disposed below the window WM.

The display module DM may include at least a display panel DP. FIG. 2 illustrates only the display panel DP of a stacked structure of the display module DM. However, the display module DM may substantially further include not only the display panel DP but also a plurality of components disposed above the display panel DP. The stacked structure of the display module DM will be described later in detail.

The display panel DP is not particularly limited, and may include, for example, an organic light emitting display panel or an inorganic light emitting display panel. The display panel DP includes a display region DP-DA and a non-display region DP-NDA respectively corresponding to the display region DA and the non-display region NDA which are illustrated in FIG. 1. In the present disclosure, "a region/portion corresponds to another region/portion" means that the regions/portions overlap each other (e.g., corresponding to each other along the thickness direction and/or in a plan view), and is not limited to the regions/portions having the same area.

A pad region PA of the display panel DP is disposed in the non-display region DP-NDA and at one side of the display region DP-DA. The pad region PA is a region at which the display panel DP is electrically bonded (or connected) to a flexible circuit board FCB to be described later.

The upper member UM may include a protective film and/or an optical film. The optical film may include a polarizer and a retarder to reduce the reflectance of external light. The lower member LM may include a protective film, which protects the display panel DP, a support member, which supports the display panel DP, a digitizer, etc. The upper member UM and the lower member LM will be described later in detail.

The flexible circuit board FCB illustrated in FIG. 2 is disposed below the display panel DP. The flexible circuit board FCB may be bonded to the display panel DP at a rear surface of the display panel DP, and electrically connects the display panel DP and a main circuit board which is not illustrated, to each other. The flexible circuit board FCB includes at least one insulating layer and at least one conductive layer. The conductive layer may include a plurality of signal lines.

The driving chip DIC may be mounted on the flexible circuit board FCB. The driving chip DIC may include driving circuits, for example, a data driving circuit, for driving the pixels PX of the display panel DP. FIG. 2 illustrates a structure in which the driving chip DIC is mounted on the flexible circuit board FCB, but an embodiment of the invention is not limited thereto. For example, the driving chip DIC may be mounted on the display panel DP or the main circuit board.

The electronic module EM may include a control module, a wireless communication module, an image input module, a sound input module, a sound output module, a memory, an external interface module, and so on. The electronic module EM may include a main circuit board, and the modules may be mounted on the main circuit board and/or electrically connected to the main circuit board through a flexible circuit board FCB. The electronic module EM is electrically connected to the power supply module PSM.

Although not separately illustrated, the electronic device ED may further include an electro-optical module. The electro-optical module may be an electronic component for outputting or receiving an optical signal. The electro-optical module may include a camera module and/or a proximity sensor. The camera module may capture an external image through a region of the display panel DP.

The housing HM illustrated in FIG. 2 is connected to the display device DD, particularly to the window WM, and receives the other modules described above. The housing HM is illustrated as having an integrated shape, but is not limited thereto. The housing HM may include a plurality of parts (for example, side edge parts and a bottom part) that are coupled to each other.

FIG. 3 additionally illustrates adhesive layers AL1 to AL4 and a resin structure LS, which are not illustrated in FIG. 2.

The window WM may include a base substrate BS and a bezel pattern BM which is disposed on a lower surface of the base substrate BS. The lower surface may be closest to the display module DM. The base substrate BS may include a synthetic resin film or a glass substrate. The base substrate BS may have a multilayer structure. The base substrate BS may include a thin film glass substrate, a protective film disposed on the thin film glass substrate, and an adhesive layer which bonds the thin film glass substrate and the protective film.

The bezel pattern BM may be formed or provided as a colored light-shielding film using, for example, a coating method. The bezel pattern BM may include a base material and a dye or pigment which is combined with the base material. The bezel pattern BM overlaps the non-display region NDA illustrated in FIG. 1 and the bezel region BA illustrated in FIG. 2. The bezel pattern BM may be disposed on the lower surface of the base substrate BS. When the base substrate BS has a multilayer structure, the bezel pattern BM may be disposed between interfaces defined between a plurality of layers. For example, the bezel pattern BM may be disposed between the thin film glass substrate and the protective film. Although not separately illustrated, the window WM may further include at least one of a hard coating layer, an anti-fingerprint layer, or an anti-reflection layer ARL on an upper surface of the base substrate BS. The upper surface may be furthest from the display module DM.

The upper member UM may include an upper film UF. The upper film UF may include a synthetic resin film. The synthetic resin film may include polyimide, polycarbonate, polyamide, triacetylcellulose, polymethylmethacrylate, or polyethylene terephthalate.

The upper film UF may absorb external impact applied to or from a front surface of the display device DD (e.g., an impact absorbing layer). In an embodiment of the invention, the display module DM may include a color filter which replaces a polarizing film as an anti-reflection member, thereby reducing the impact strength applied to the front surface of the display device DD. The upper film UF may compensate for the impact strength reduced due to application of the color filter.

The upper film UF overlaps the bezel region BA and the transmission region TA. The upper film UF may overlap only a partial region of the bezel region BA. A portion of the bezel pattern BM may be exposed from the upper film UF. In an embodiment of the invention, the upper film UF may be omitted.

The upper member UM may further include a first adhesive layer AL1, which bonds the upper film UF and the window WM to each other, and a second adhesive layer AL2 which bonds the upper film UF and the display module DM to each other. The first adhesive layer AL1 and the second adhesive layer AL2 may each be a pressure sensitive adhesive film (PSA) or an optically clear adhesive (OCA). Adhesive layers to be described herebelow may also include the same adhesive as the first adhesive layer AL1.

The display module DM is disposed below the upper film UF. The display module DM overlaps the bezel region BA and the transmission region TA. The display module DM may fully overlap the upper film UF in the bezel region BA. A side surface of the display module DM may be aligned with a side surface of the upper film UF at the end of the electronic device. On a plane, a corner of the display module DM may be aligned with a corner of the upper film UF.

At least the pad region PA of the display module DM may overlap the upper film UF, in the bezel region BA. The pad region PA overlapping a lower surface of the upper film UF may be bonded to the upper film UF at the lower surface of the upper film UF, via the second adhesive layer AL2. The pad region PA overlaps the upper film UF, and the pad region PA is bonded to the upper film UF so that the upper film UF may sufficiently support the pad region PA when the flexible circuit board FCB is bonded to the pad region PA. This will be described later in detail.

The lower member LM may include a lower film PF, a cover panel CP, a third adhesive layer AL3, and a fourth adhesive layer AL4. The lower member LM may further include a support plate and a digitizer, which are not illustrated.

The lower film PF may be disposed below the display module DM, and may be bonded to the display module DM, at a lower surface of the display module DM, via the third adhesive layer AL3. The lower surface may be furthest from the window WM. The lower film PF may protect a lower portion of the display module DM. The lower film PF may include a flexible synthetic resin film. For example, the lower film PF may include polyethylene terephthalate or polyimide, and is not limited thereto.

The lower film PF exposes at least the pad region PA, to outside the lower film PF. In an embodiment, the lower layer (e.g., the lower film PF) is non-overlapping with the pad region PA. The lower film PF may have a smaller area (e.g., planar area) than the display module DM. For example, the lower film PF may overlap only the display region DA.

In an embodiment, the lower film PF may have substantially the same area as the display module DM. An open region PF-OP (hereinafter referred to as a first open region) corresponding to the pad region PA, may be defined in the lower film PF. Although the lower film PF entirely protects the lower surface of the display module DM, the first open region PF-OP is defined to expose the pad region PA to outside the lower film PF so that the flexible circuit board FCB is allowed to approach and be connected to the display module DM at the pad region PA.

The planar shape of the first open region PF-OP is not particularly limited. The first open region PF-OP may have a notch shape. In an embodiment of the invention, edges defining the first open region PF-OP may have a closed line shape in the plan view.

As illustrated in FIG. 3, the fourth adhesive layer AL4 bonds the lower film PF and the cover panel CP to each other. The cover panel CP may increase resistance against a compressive force caused by external pressure. Thus, the cover panel CP may serve to prevent deformation of the display panel DP. The cover panel CP may include a flexible plastic material such as polyimide or polyethylene terephthalate. In addition, the cover panel CP may be a colored film having a low light transmittance. The cover panel CP may absorb light incident from the outside. For example, the cover panel CP may be a black synthetic resin film. When the display device DD is seen from above the window WM, components disposed below the cover panel CP may not be visible to a user.

A cavity CP-C may be defined in (or by portions of) the cover panel CP. The cavity CP-C may be a recess which is recessed in a direction toward the display module DM, from a lower surface of the cover panel CP. The flexible circuit board FCB which is bent along an end surface of the lower film PF and the cover panel CP, may dispose the driving chip DIC inserted into the cavity CP-C. The cavity CP-C may remove or compensate for a stepped structure or an irregular portion formed (or provided) by the driving chip DIC together with the flexible circuit board FCB. The cavity CP-C is not limited to the cavity CP-C of the cover panel CP as long as being defined in a member disposed on a lowest side of the lower member LM.

The cover panel CP, which is non-aligned with the lower film PF in the bezel region BA, is illustrated as an example, but an embodiment of the invention is not limited thereto. The cover panel CP may have substantially the same shape and/or planar area as the lower film PF.

The support plate may be disposed below the cover panel CP. The support plate may include a metal material with high strength. The support plate may include a reinforced fiber composite material. The support plate may include a reinforced fiber which is disposed inside a matrix part of the support plate. The reinforced fiber may be a carbon fiber or a glass fiber. The matrix part may include a polymer resin. The matrix part may include a thermoplastic resin. For example, the matrix part may include a polyamide-based resin or a polypropylene-based resin. For example, the reinforced fiber composite material may be a carbon fiber reinforced plastic (CFRP) or a glass fiber reinforced plastic (GFRP).

The resin structure LS bonds the flexible circuit board FCB to the display module DM, at an end surface of the display module DM. The resin structure LS may be extended along and cover the side surface (or end surface) of the upper film UF, the side surface of the display module DM, and a side surface of the cover panel CP. The resin structure LS is disposed inside the window WM, on a plane. The resin structure LS does not protrude outward from the window WM (e.g., further than an end surface of the window WM) so that interference due to the resin structure LS may not occur when the housing HM (see FIG. 2) and the window WM are coupled to each other.

The resin structure LS may fill the first open region PF-OP. The resin structure LS may be formed using an insert-molding method. The resin structure LS may include an acryl-based resin, and the type of the resin is not particularly limited. The resin structure LS may include polypropylene (PP), polyethylene (PE), polystyrene (PS), acrylonitrile-styrene (AS), or polymethyl methacrylate (PMMA).

Figure 4:
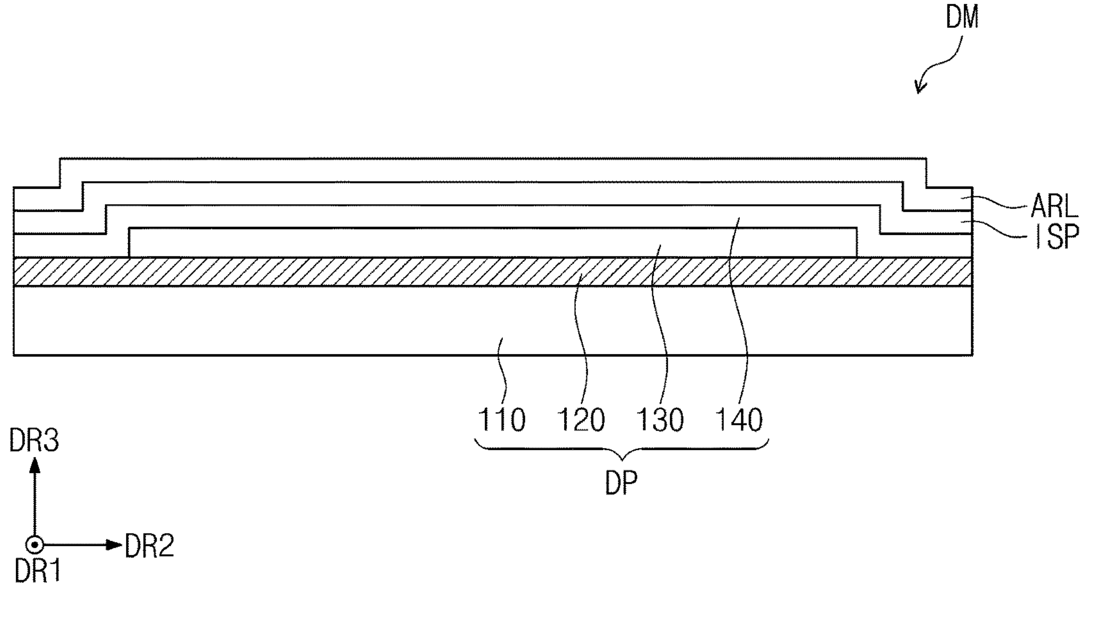
FIG. 4 is a cross-sectional view of a display module according to an embodiment of the invention.
Figure 5:
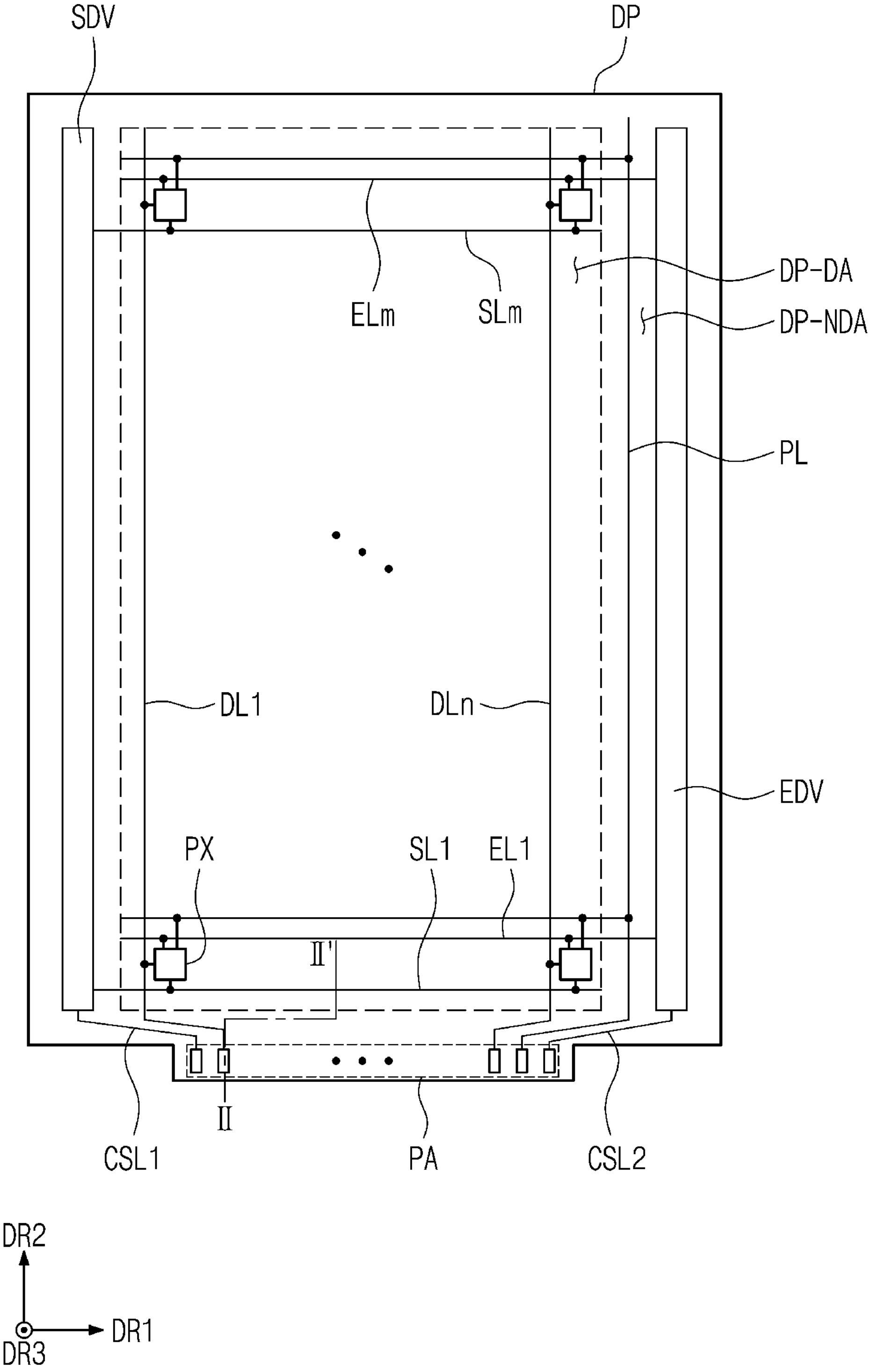
FIG. 5 is a plan view of a display panel according to an embodiment of the invention.

FIG. 4 is a cross-sectional view of a display module DM according to an embodiment of the invention. FIG. 5 is a plan view of a display panel DP according to an embodiment of the invention.

Referring to FIG. 4, the display module DM may include the display panel DP, an input sensor ISP, and an anti-reflection layer ARL. The display panel DP may include a base layer 110, a circuit layer 120, a light emitting element layer 130, and an encapsulation layer 140, in order along the thickness direction.

The base layer 110 may provide a base surface on which the circuit layer 120 is disposed. The base layer 110 may be a flexible substrate that is bendable, foldable, or rollable. The base layer 110 may be a glass substrate, a metal substrate, a polymer substrate, or the like. However, an embodiment of the invention is not limited thereto, and the base layer 110 may be an inorganic layer, an organic layer, or a composite material layer.

The base layer 110 may have a multilayer structure. For example, the base layer 110 may include a first synthetic resin layer, a second synthetic resin layer, and inorganic layers disposed between the first and second synthetic resin layers. Each of the first and second synthetic resin layers may include a polyimide-based resin, and is not particularly limited.

The circuit layer 120 may be disposed on the base layer 110. The circuit layer 120 may include an insulating layer, a semiconductor pattern, a conductive pattern, a signal line, and so on.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro LED or a nano LED. The light emitting layer, alone or together with the circuit layer 120, may define a display element layer which generates an image IM, without being limited thereto.

The encapsulation layer 140 may be disposed on the light emitting element layer 130. The encapsulation layer 140 may protect the light emitting element layer 130 from moisture, oxygen, and foreign substances such as dust particles. The encapsulation layer 140 may include at least one inorganic layer. The encapsulation layer 140 may include a stacked structure in which an inorganic layer/an organic layer/an inorganic layer are stacked.

The input sensor ISP may be disposed directly on the display panel DP. The input sensor ISP may detect a user's input by using a capacitance method. The display panel DP and the input sensor ISP may be formed through a continuous process. Here, "being disposed directly" may mean that a third component is not disposed between the input sensor ISP and the display panel DP. That is, a separate adhesive layer may not be disposed between the input sensor ISP and the display panel DP. As a separate layer or third element is not disposed between the input sensor ISP and the display panel DP, the input sensor ISP and the display panel DP may contact each other.

The anti-reflection layer ARL may be disposed directly on the input sensor ISP. The anti-reflection layer ARL may reduce the reflectance of external light incident from the outside of the display device DD. The anti-reflection layer ARL may include color filters. The color filters may have a predetermined arrangement. For example, the color filters may be arranged while considering emission colors of the pixels PX included in the display panel DP. In addition, the anti-reflection layer ARL may further include a black matrix adjacent to the color filters.

In an embodiment of the invention, the anti-reflection layer ARL may be replaced by a polarizing film. The polarizing film may be bonded to the input sensor ISP through an adhesive layer.

Referring to FIG. 5, the display panel DP may include a display region DP-DA and a non-display region DP-NDA around the display region DP-DA. Pixels PX are disposed in the display region DP-DA. A scan driving unit SDV, a data driving unit, and an emission driving unit EDV may be disposed in the non-display region DP-NDA. The data driving unit may be a part of circuits constituting the driving chip DIC illustrated in FIG. 3.

The display panel DP may include a plurality of pixels PX, a plurality of scan lines SL1 to SLm, a plurality of data lines DL1 to DLn, a plurality of emission lines EL1 to Elm, first and second control lines CSL1 and CSL2, and a power line PL. Here, 'm' and 'n' are natural numbers. The pixels PX may be connected to the scan lines SL1 to SLm, the data lines DL1 to DLn, and the emission lines EL1 to ELm.

The scan lines SL1 to SLm may extend in the second direction DR2 to be connected to the scan driving unit SDV. The emission lines EL1 to ELm may extend in the first direction DR1 to be connected to the emission driving unit EDV.

The power line PL may include a part extending in the second direction DR2 and a part extending in the first direction DR1. The part extending in the first direction DR1 and the part extending in the second direction DR2 may be disposed on different layers. The power line PL may supply a first voltage to the pixels PX.

Each of the data lines DL1 to DLn extends in the second direction DR2, and has an end disposed in a pad region PA. The data lines DL1 to DLn may be electrically connected to the driving chip DIC. The first control line CSL1 is connected to the scan driving unit SDV, and has an end (e.g., a distal end) disposed in the pad region PA. The second control line CSL2 is connected to the emission driving unit EDV, and has an end disposed in the pad region PA.

Figure 6:
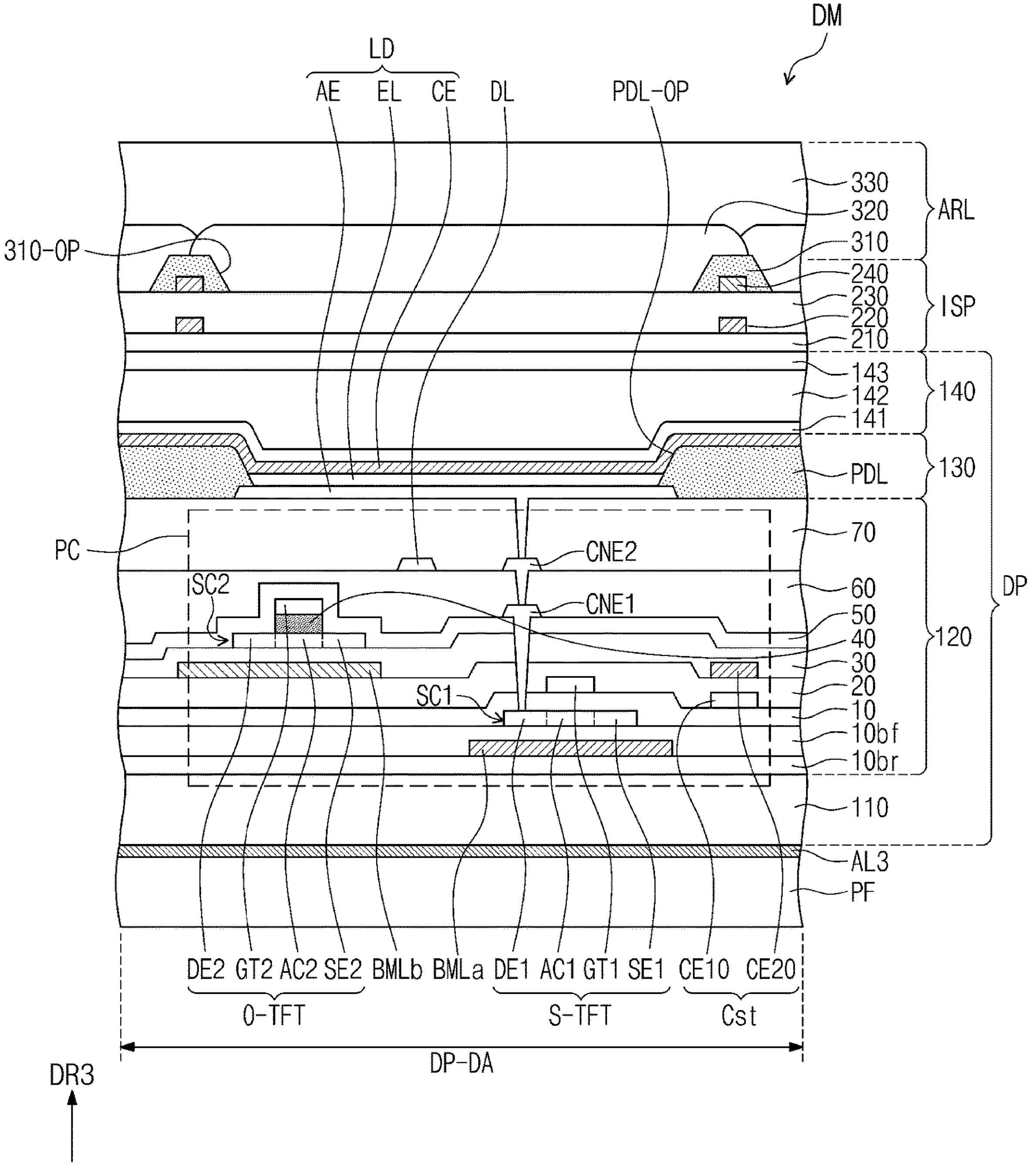
FIG. 6 is an enlarged cross-sectional view of a display module according to an embodiment of the invention.

FIG. 6 is a first cross-sectional view of a display module DM according to an embodiment of the invention. FIG. 6 may be a cross-sectional view of the display module DM of FIG. 4, at the light emitting layer 130. FIGS. 7A to 7E are second cross-sectional views of the display module DM according to an embodiment of the invention. FIG. 7F is an enlarged view of FIG. 7E. FIG. 7G is a second cross-sectional view of the display module according to an embodiment of the invention. FIG. 6 is a detailed view of a cross section corresponding to a light emitting element LD in a display region DP-DA. FIGS. 7A to 7G are detailed views of a non-display region DP-NDA in which a pad region PA is disposed. FIGS. 7A to 7E and 7G are cross-sectional views corresponding to line II-IF in FIG. 5.

A pixel circuit PC, which drives the light emitting element LD, may include a plurality of transistors. FIG. 6 illustrates a silicon transistor S-TFT and an oxide transistor O-TFT. These are illustrated as an example. The pixel circuit PC may include only one type of transistor among the silicon transistor S-TFT and the oxide transistor O-TFT.

Referring to FIG. 6, a base layer 110 is illustrated as a single layer. The base layer 110 may include a synthetic resin such as polyimide. The base layer 110 may be formed by coating a carrier substrate with a synthetic resin layer. When a display module DM is completed by performing a post-process, the carrier substrate may be removed. FIG. 6 additionally illustrates a lower film PF bonded to a lower side of the base layer 110 via a third adhesive layer AL3. After the carrier substrate is removed, the lower film PF may be attached to a lower surface of the base layer 110.

Referring to FIG. 6, a barrier layer 10*br* may be disposed on the base layer 110. The barrier layer 10*br* prevents introduction of foreign substances from the outside. The barrier layer 10*br* may include at least one inorganic layer. The barrier layer 10*br* may include a silicon oxide layer and a silicon nitride layer. The silicon oxide layer and the silicon nitride layer may be each provided in plurality, and a plurality of silicon oxide layers and a plurality of silicon nitride layers may be alternately stacked.

A first shield electrode BMLa may be disposed on the barrier layer 10*br*. The first shield electrode BMLa may include a metal. The first shield electrode BMLa may include molybdenum (Mo), a molybdenum-containing alloy, titanium (Ti), or a titanium-containing alloy, which has good heat resistance. The first shield electrode BMLa may receive a bias voltage. The first shield electrode BMLa may receive a first power supply voltage ELVDD. The first shield electrode BMLa may block an electrical potential caused by polarization from affecting the silicon transistor S-TFT. The first shield electrode BMLa may block external light from arriving at the silicon transistor S-TFT. In an embodiment of the invention, the first shield electrode BMLa may be a floating electrode that is isolated (e.g., electrically isolated) from another electrode or wiring.

A buffer layer 10*bf* may be disposed on the barrier layer 10*br*. The buffer layer 10*bf* may prevent metal atoms or impurities from diffusing from the base layer 110 into a first semiconductor pattern SC1 thereabove. The buffer layer 10*bf* may include at least one inorganic layer. The buffer layer 10*bf* may include a silicon oxide layer and a silicon nitride layer.

The first semiconductor pattern SC1 may be disposed on the buffer layer 10*bf*. The first semiconductor pattern SC1 may include a silicon semiconductor. For example, the silicon semiconductor may include amorphous silicon, polycrystalline silicon, etc. For example, the first semiconductor pattern SC1 may include low-temperature polysilicon.

The first semiconductor pattern SC1 may have different electrical properties at various regions, depending on whether the first semiconductor pattern SC1 is doped or not at such regions. The first semiconductor pattern SC1 may include a first region with high conductivity and a second region with low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or may be doped with the doping concentration lower than that of the first doped region.

The conductivity of the first region may be higher than the conductivity of the second region, and the first region may substantially serve as an electrode or a signal line. The second region may substantially correspond to a channel region (or active region) of a transistor. In other words, one portion of the first semiconductor pattern SC1 may be a channel of the transistor, another portion may be a source or a drain of the transistor, and still another portion may be a connection electrode or a connection signal line.

A source region SE1, a channel region AC1 (or active region), and a drain region DE1 of the silicon transistor S-TFT may be formed from the first semiconductor pattern SC1. The source region SE1 and the drain region DE1 may extend from the channel region AC1 in opposite directions, on a cross section.

A first insulating layer 10 may be disposed on the buffer layer 10*bf*. The first insulating layer 10 may cover the first semiconductor pattern SC1. The first insulating layer 10 may be an inorganic layer. The first insulating layer 10 may be a single-layered silicon oxide layer. Not only the first insulating layer 10, but also an inorganic layer of a circuit layer 120 to be described later may have a single-layer structure or a multilayer structure, and may include at least one among the materials described above. However, an embodiment of the invention is not limited thereto.

A gate GT1 of the silicon transistor S-TFT is disposed on the first insulating layer 10. The gate GT1 may be a portion of a metal pattern, that is, a respective pattern of a metal layer including a plurality of metal patterns. The gate GT1 overlaps the channel region AC1. The gate GT1 may function as a mask in a process for doping the first semiconductor pattern SC1. A first electrode CE10 of a storage capacitor Cst is disposed on the first insulating layer 10. Unlike what is illustrated in FIG. 6, the first electrode CE10 may be integrally formed with the gate GT1.

A second insulating layer 20 may be disposed on the first insulating layer 10 and cover the gate GT1. Although not illustrated, an upper electrode overlapping the gate GT1 may be disposed on the second insulating layer 20. A second electrode CE20 overlapping the first electrode CE10 may be disposed on the second insulating layer 20.

A second shield electrode BMLb is disposed on the second insulating layer 20. The second shield electrode BMLb may be disposed to correspond to a lower portion of the oxide transistor O-TFT. In an embodiment of the invention, the second shield electrode BMLb may be omitted. According to an embodiment of the invention, the first shield electrode BMLa may extend from the silicon transistor S-TFT and along the base layer 110 to the lower portion of the oxide transistor O-TFT, and thus replace the second shield electrode BMLb.

A third insulating layer 30 may be disposed on the second insulating layer 20. A second semiconductor pattern SC2 may be disposed on the third insulating layer 30. The second semiconductor pattern SC2 may include a channel region AC2 of the oxide transistor O-TFT. The second semiconductor pattern SC2 may include an oxide semiconductor. The second semiconductor pattern SC2 may include a transparent conductive oxide (TCO) such as indium tin oxide (ITO), indium zinc oxide (IZO), indium gallium zinc oxide (IGZO), zinc oxide (ZnOx), or indium oxide ($In_2O_3$).

The oxide semiconductor may include a plurality of regions classified according to whether the transparent conductive oxide is reduced or not. A region in which the transparent conductive oxide is reduced (hereinafter referred to as a reduced region), has higher conductivity than a region in which the transparent conductive oxide is not reduced (hereinafter referred to as a non-reduced region). The reduced region substantially serves as a source/drain or a signal line of a transistor. The non-reduced region substantially corresponds to a semiconductor region (or channel) of the transistor. In other words, one portion of the second semiconductor pattern SC2 may be the semiconductor region of the transistor, another portion may be the source/drain region of the transistor, and still another portion may be a signal transfer region.

A fourth insulating layer 40 may be disposed on the third insulating layer 30. As illustrated in FIG. 6, the fourth insulating layer 40 may be an insulating pattern overlapping a gate GT2 of the oxide transistor O-TFT and exposed by a source region SE2 and a drain region DE2 of the oxide transistor O-TFT. In an embodiment of the invention, the fourth insulating layer 40 may overlap, in common, a plurality of pixels PX and cover the second semiconductor pattern SC2.

The gate GT2 of the oxide transistor O-TFT is disposed on the fourth insulating layer 40. The gate GT2 of the oxide transistor O-TFT may be a portion of a metal pattern. The gate GT2 of the oxide transistor O-TFT overlaps the channel region AC2.

A fifth insulating layer 50 may be disposed on the fourth insulating layer 40, and the fifth insulating layer 50 may cover the gate GT2. Each of the first insulating layer 10 to the fifth insulating layer 50 may be an inorganic layer.

A first connection electrode CNE1 may be disposed on the fifth insulating layer 50. The first connection electrode CNE1 may be connected to the drain region DE1 of the silicon transistor S-TFT through a contact hole passing through the first to fifth insulating layers 10, 20, 30, 40 and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 through (or at) a contact hole passing through the sixth insulating layer 60. A data line DL may be disposed on the sixth insulating layer 60. A seventh insulating layer 70 may be disposed on the sixth insulating layer 60, and cover the second connection electrode CNE2 and the data line DL. Each of the sixth insulating layer 60 and the seventh insulating layer 70 may be an organic layer.

The light emitting element LD may include an anode AE (or first electrode), an emission layer EL, and a cathode CE (or second electrode). The anode AE of the light emitting element LD may be disposed on the seventh insulating layer 70. The anode AE may be a (semi-)transmissive electrode or a reflective electrode.

A pixel defining layer PDL may be disposed on the seventh insulating layer 70. The pixel defining layer PDL may include the same material and be formed through the same process. The pixel defining layer PDL may have a light absorbing property, and for example, the pixel defining layer PDL may have a black color. The pixel defining layer PDL may include a black coloring agent. The black coloring agent may include a black dye or a black pigment. The black coloring agent may include a carbon black, a metal such as chrome, or an oxide thereof. The pixel defining layer PDL may correspond to a light shielding pattern having a light shielding property.

The pixel defining layer PDL may cover a portion of the anode AE. For example, an opening portion PDL-OP exposing a portion of the anode AE to outside the pixel defining layer PDL, may be defined in (or by portions of) the pixel defining layer PDL.

Although not illustrated, a hole control layer may be disposed between the anode AE and the emission layer EL. The hole control layer may include a hole transport layer and further include a hole injection layer. An electron control layer may be disposed between the emission layer EL and the cathode CE. The electron control layer may include an electron transport layer and further include an electron injection layer. The hole control layer and the electron control layer may be formed, in common, in the display region DP-DA (see FIG. 5) using an open mask.

An encapsulation layer 140 may be disposed on a light emitting element layer 130. The encapsulation layer 140 may include an inorganic encapsulation layer 141, an organic encapsulation layer 142, and an inorganic encapsulation layer 143, which are stacked in sequence. However, layers constituting the encapsulation layer 140 are not limited thereto.

The inorganic encapsulation layers 141 and 143 may protect the light emitting element layer 130 from moisture and oxygen, and the organic encapsulation layer 142 may protect the light emitting element layer 130 from foreign substances such as dust particles. The inorganic encapsulation layers 141 and 143 may include a silicon nitride layer, a silicon oxynitride layer, a silicon oxide layer, a titanium oxide layer, an aluminum oxide layer, or the like. The organic encapsulation layer 142 may include an acrylic organic layer, and is not limited thereto.

An input sensor ISP may be disposed on a display panel DP. The input sensor ISP may include at least one conductive layer and at least one insulating layer. In this embodiment, the input sensor ISP may include a first insulating layer 210, a first conductive layer 220, a second insulating layer 230, and a second conductive layer 240.

The first insulating layer 210 may be disposed directly on the display panel DP. The first insulating layer 210 may be an inorganic layer including at least one of silicon nitride, silicon oxynitride, or silicon oxide. Each of the first conductive layer 220 and the second conductive layer 240 may have a single-layer structure or a multilayer structure in which layers are stacked along the third direction DR3. The first conductive layer 220 and the second conductive layer 240 may include conductive lines that define a mesh-shaped electrode. The mesh-shaped electrode may include the conductive lines as solid portions spaced apart from each other, and spaces defined therebetween, without being limited thereto. The conductive line of the first conductive layer 220 and the conductive line of the second conductive layer 240 may be connected to each other through a contact hole passing through the second insulating layer 230, or may not be connected to each other. A connection relationship between the conductive line of the first conductive layer 220 and the conductive line of the second conductive layer 240 may be determined depending on the type of a sensor formed as the input sensor ISP.

When having a single-layer structure, each of the first conductive layer 220 and the second conductive layer 240 may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnOx), or indium zinc tin oxide (IZTO). In addition, the transparent conductive layer may include a conductive polymer such as PEDOT, metal nanowire, graphene, etc.

When having a multilayer structure, each of the first conductive layer 220 and the second conductive layer 240 may include metal layers. The metal layers may have, for example, a three-layer structure including titanium/aluminum/titanium. The conductive layer having a multilayer structure may include at least one metal layer and at least one transparent conductive layer. The second insulating layer 230 may be disposed between the first conductive layer 220 and the second conductive layer 240.

An anti-reflection layer ARL may be disposed on the input sensor ISP. The anti-reflection layer ARL may include a division layer 310, a color filter 320, and a planarization layer 330.

A material constituting the division layer 310 is not particularly limited as long as being a material that absorbs light. The division layer 310 may include a plurality of patterns which are spaced apart from each other, without being limited thereto. The patterns of the division layer 310 may have a black color, and in an embodiment, the division layer 310 may include a black coloring agent. The black coloring agent may include a black dye or a black pigment. The black coloring agent may include a carbon black, a metal such as chrome, or an oxide thereof.

Patterns of the division layer 310 may cover the second conductive layer 240 of the input sensor ISP. The division layer 310 may prevent external light from being reflected by the second conductive layer 240. An opening portion 310-OP may be defined by patterns of the division layer 310, where the solid portions (e.g., patterns) and the opening portion 310-OP together define the division layer 310. The opening portion 310-OP may overlap the anode AE. The color filter 320 may overlap the opening portion 310-OP. The color filter 320 may be in contact with the division layer 310.

The planarization layer 330 may cover the division layer 310 and the color filter 320. The planarization layer 330 may include an organic matter, and an upper surface of the planarization layer 330 may be provided with a flat surface. In an embodiment of the invention, the planarization layer 330 may be omitted.

Figure 7A:
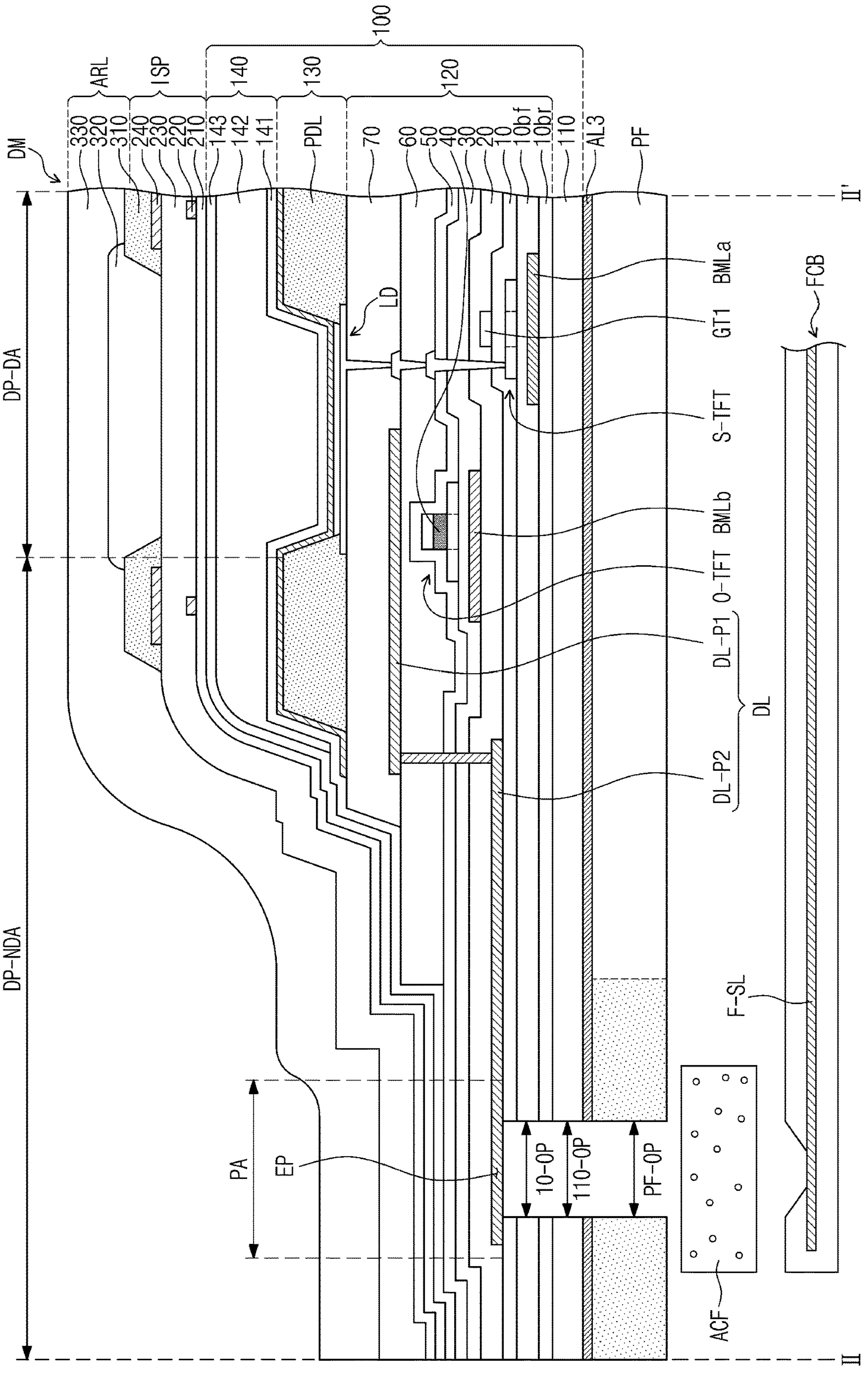
FIGS. 7A to 7E are enlarged cross-sectional views of the display module according to an embodiment of the invention.

Referring to FIG. 7A, the barrier layer 10*br*, the buffer layer 10*bf*, and the first insulating layer 10 to the fifth insulating layer 50 are in both the display region DP-DA and the non-display region DP-NDA, and may entirely overlap the display region DP-DA and the non-display region DP-NDA. The sixth insulating layer 60, the seventh insulating layer 70, and the pixel defining layer PDL are in the display region DP-DA, and extend into the non-display region DP-NDA to define an end surface in the non-display are DP-NDA. An element which "entirely overlaps" the display region DP-DA and the non-display region DP-NDA, may be disposed in an entirety of the display region DP-DA and the non-display region DP-NDA and/or may define an end surface which extends to an end of the display module DM, without being limited thereto.

The sixth insulating layer 60, the seventh insulating layer 70, and the pixel defining layer PDL (together as a stacked structure) which terminate in the non-display region DP-NDA, expose the fifth insulating layer 50 in the non-display region DP-NDA, to outside the stacked structure. The inorganic encapsulation layers 141 and 143 of the encapsulation layer 140 may be in contact with the exposed portion of the fifth insulating layer 50. As being in contact, elements may form an interface therebetween, without being limited thereto. It is illustrated that the first and second insulating layers 210 and 230 of the input sensor ISP, and the planarization layer 330 of the anti-reflection layer ARL, also entirely overlap the display region DP-DA and the non-display region DP-NDA. However, an embodiment of the invention is not limited thereto.

The data line DL may include a plurality of parts disposed on different layers. The plurality of parts may include conductive patterns in different layers from each other. As illustrated in FIG. 7A, the data line DL may include a first part DL-P1 disposed on the sixth insulating layer 60, and a second part DL-P2 disposed on the first insulating layer 10. In FIG. 7A, a transistor electrically connected to the data line DL is not illustrated.

Since the second part DL-P2 is formed through the same process as the gate GT1 of the silicon transistor S-TFT, such as to be in a same layer as the gate GT1, the second part DL-P2 may have the same material and the same stacked structure as the gate GT1. The first part DL-P1 is disposed in the display region DP-DA, and in the non-display region DP-NDA, the first part DL-P1 is connected to the second part DL-P2 through a contact hole passing through the second to sixth insulating layers 20 to 60 as a collective insulating layer. In an embodiment of the invention, the data line DL may include only a part disposed on any one insulating layer, and is not particularly limited.

An end portion EP of the second part DL-P2 may overlap the pad region PA. The end portion EP of the second part DL-P2 may be defined as a pad portion of the data line DL or of the display panel 100. The display panel 100 may constitute the display panel DP illustrated in FIG. 4.

FIG. 7A illustrates a first open region PF-OP of the lower film PF, which exposes the end portion EP of the second part DL-P2 to outside the display module DM, together with other open regions. Although not illustrated, edges (or sidewalls) of the lower film PF which define the first open region PF-OP may define a closed line on a plane. The first open region PF-OP may be spaced apart from an end surface of the display module DM, by a solid portion of the lower film PF.

An open region 110-OP (hereinafter referred to as a second open region), which corresponds to the end portion EP of the second part DL-P2, is defined in the base layer 110. The second open region 110-OP having the same size (e.g., planar size or planar area) as the first open region PF-OP is illustrated as an example, but an embodiment of the invention is not limited thereto. One open region among the first open region PF-OP and the second open region 110-OP may be larger than the other. For example, the first open region PF-OP may extend to the corner and/or end surface of the base layer 110 to define a notch in the lower film PF on a plane. In an embodiment of the invention, when the lower film PF has a substantially smaller area than the base layer 110 to expose the pad region PA, a hatched portion of the lower film PF, which is illustrated in FIG. 7A, may be further removed.

An open region 10-OP (hereinafter referred to as a third open region), which corresponds to the second open region 110-OP, is defined also in the insulating layers 10*br*, 10*bf* and 10 disposed between the end portion EP of the second part DL-P2 and the lower film PF. The second open region 110-OP and the third open region 10-OP may be formed through the same process, for example, a laser irradiation process. The first open region PF-OP, the second open region 110-OP, and the third open region 10-OP may be aligned with each other to define an open region which exposes the end portion EP to outside the display module DM.

The end portion EP of the second part DL-P2 may be electrically connected to a flexible circuit board FCB, such as through a bonding process. The end portion EP of the second part DL-P2 may be electrically connected to a signal line F-SL of the flexible circuit board FCB, through an anisotropic conductive film ACF. FIG. 7A illustrates the anisotropic conductive film ACF and the flexible circuit board FCB which area unattached, such as before the bonding.

According to an embodiment of the invention, the pad region PA may be disposed in a region overlapping the pixel defining layer PDL unlike what is illustrated in FIG. 7A. In FIG. 7A, the second part DL-P2 may extend along the base layer 110, in a left direction with respect to the contact hole at which the first part DL-P1 and the second part DL-P2 are connected to each other (e.g., in a direction away from the display region DP-DA. The first open region PF-OP, the second open region 110-0P, and the third open region 10-OP may also overlap the pixel defining layer PDL.

The pad region PA may be further moved in the right direction to overlap the display region DP-DA. The pad region PA may overlap, in common, the non-display region DP-NDA and the display region DP-DA, or may overlap the display region DP-DA adjacent to the non-display region DP-NDA, for example, a region overlapping the oxide transistor O-TFT.

Figure 7B:
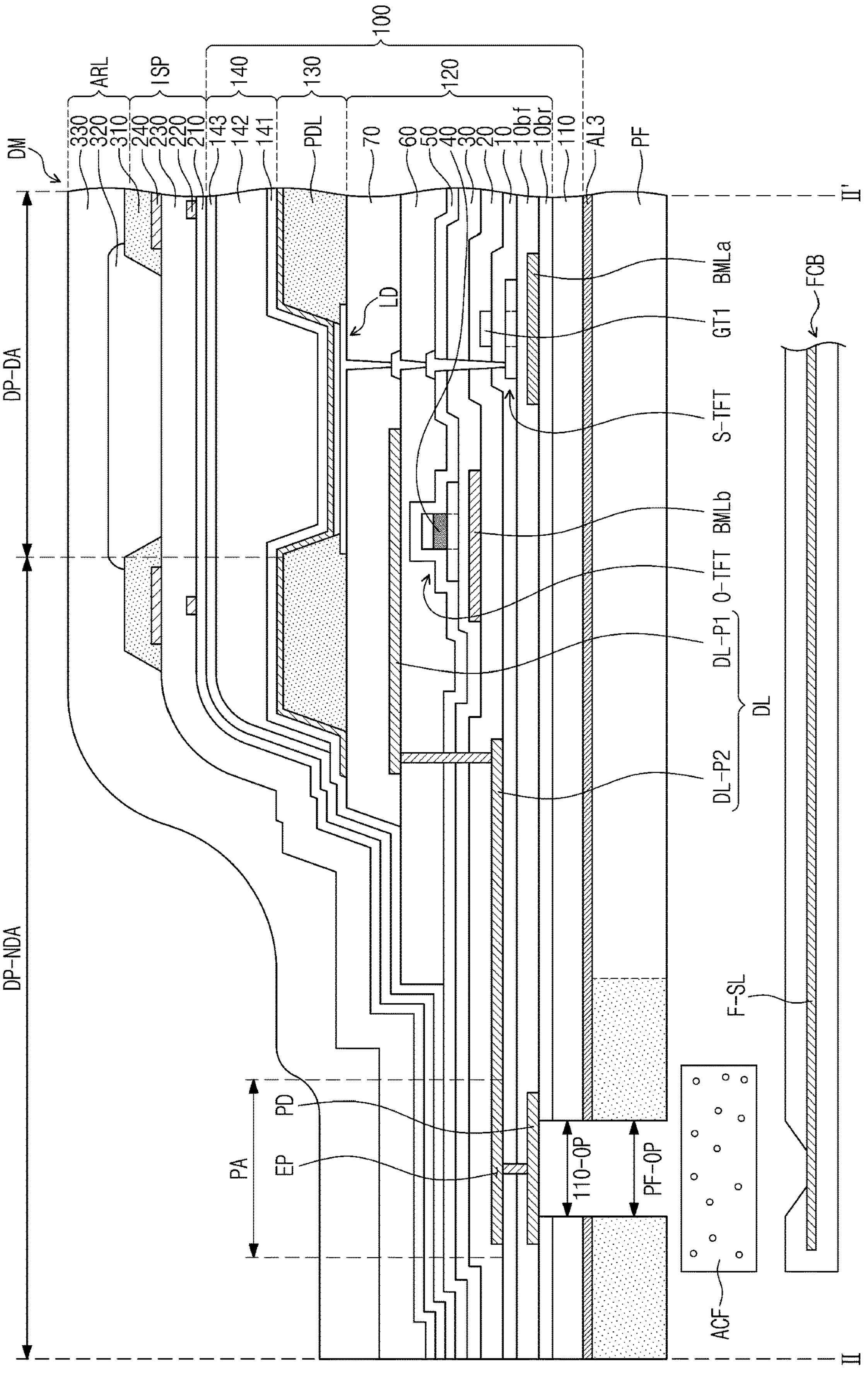

Referring to FIG. 7B, a display panel 100 may further include a pad electrode PD overlapping the end portion EP of the second part DL-P2 and disposed below the second part DL-P2 (e.g., closer to the base layer 110 than the second part DL-P2). In this embodiment, the pad electrode PD may be disposed between the barrier layer 10*br* and the buffer layer 10*bf* and formed through the same process as the first shield electrode BMLa, and have the same material and the same stacked structure as the first shield electrode BMLa (e.g., in a same layer as the first shield electrode BMLa). The end portion EP of the second part DL-P2 may be connected to the pad electrode PD through a contact hole passing through the buffer layer 10*bf* and the first insulating layer 10. The end portion EP and/or the pad electrode PD may be extended into such contact hole to connect the patterns to each other.

Figure 7C:
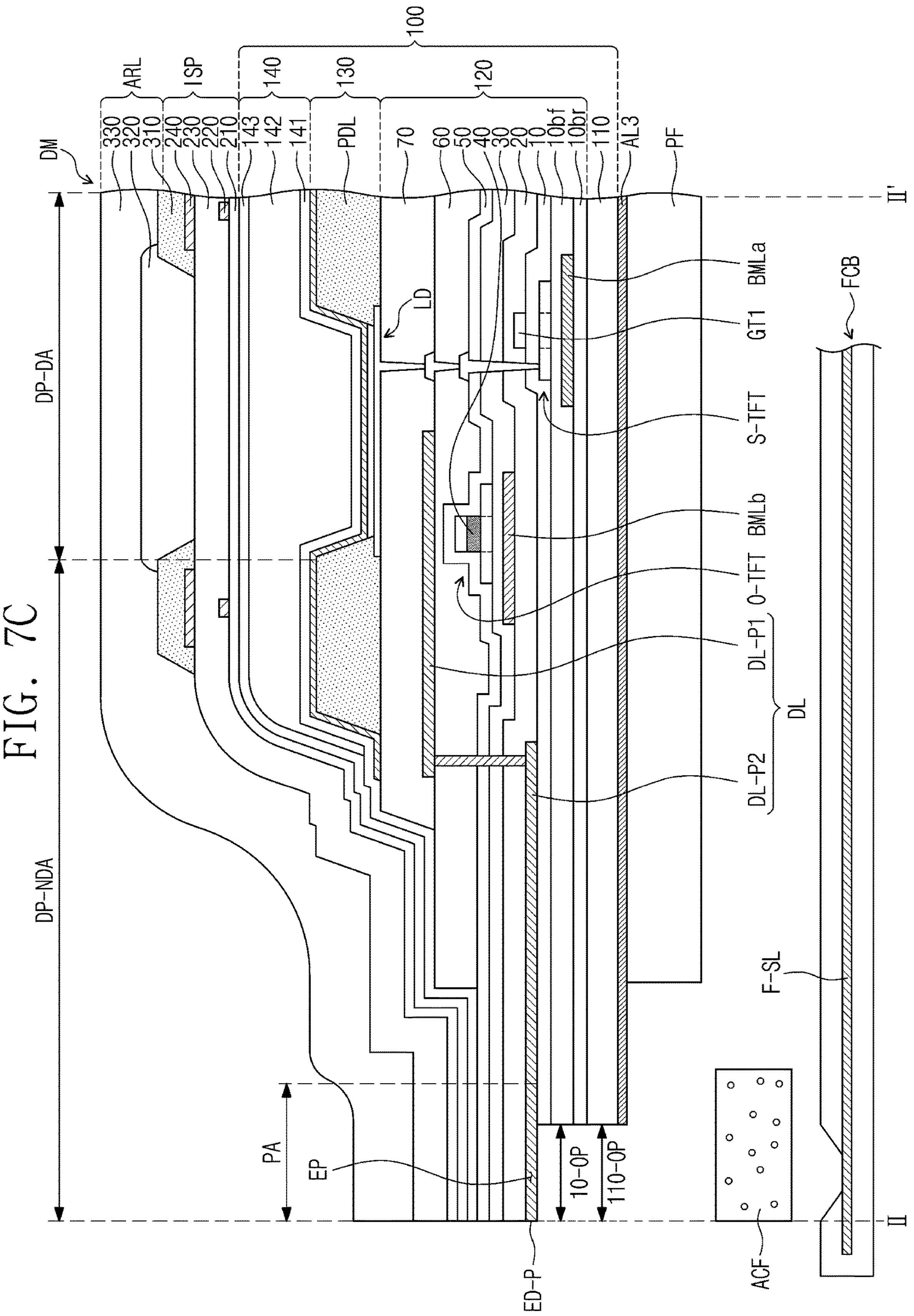

FIG. 7C illustrates the lower film PF having a substantially smaller area than the base layer 110. Referring to FIG. 7C, an end side surface ED-P of the end portion EP of the second part DL-P2 may be exposed from the second insulating layer 20. To reduce the area of the non-display region DP-NDA, the non-display region DP-NDA of the display panel 100 is additionally cut. For example, a portion of the non-display region DP-NDA in FIG. 7B which is disposed at a left side of the end portion EP illustrated in FIG. 7B, may be removed or omitted to provide the structure of FIG. 7C.

The end side surface ED-P of the end portion EP may be in contact with the resin structure LS illustrated in FIG. 3. The resin structure LS may prevent moisture from being penetrated into the side surface of the end portion EP of the second part DL-P2.

FIG. 7C illustrates that the flexible circuit board FCB is bonded after the non-display region DP-NDA of the display panel 100 is additionally cut. However, an embodiment of the invention is not limited thereto. After the flexible circuit board FCB is bonded to the display panel 100, the non-display region DP-NDA and the flexible circuit board FCB may be additionally cut. Here, an edge of the flexible circuit board FCB may be aligned with the non-display region DP-NDA of the display panel 100 unlike what is illustrated in FIG. 7C. That is, the flexible circuit board FCB may not protrude from the non-display region DP-NDA of the display panel 100 unlike what is illustrated in FIG. 7C.

Figure 7D:
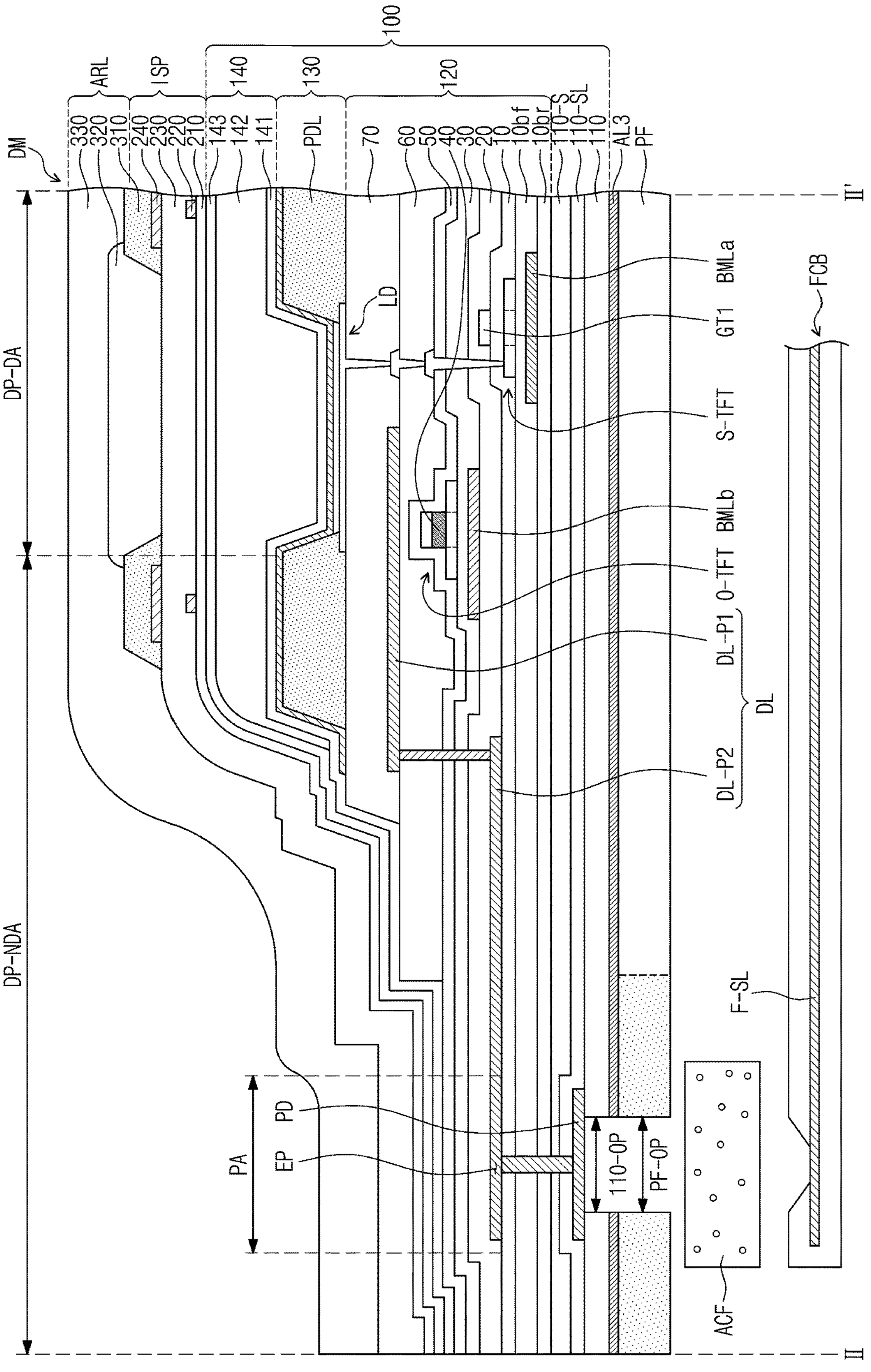

Referring to FIG. 7D, the display panel 100 may further include a sub-base layer 110-S, at least one inorganic layer 110-SL disposed between the sub-base layer 110-S and the base layer 110, and a pad electrode PD disposed between the sub-base layer 110-S and the base layer 110. In an embodiment of the invention, the at least one inorganic layer 110-SL may be omitted or have a multilayer structure including two or more layers.

The sub-base layer 110-S may include the same material as the base layer 110, for example, polyimide. The sub-base layer 110-S may have a smaller thickness than the base layer 110.

The at least one inorganic layer 110-SL may be the barrier layer 10*br* and/or the buffer layer 10*bf*, described with reference to FIG. 6. The at least one inorganic layer 110-SL blocks moisture from being penetrated upward. The at least one inorganic layer 110-SL may include any one of a silicon oxide layer, a silicon oxynitride layer, or a silicon nitride layer. The end portion EP of the second part DL-P2 may be connected to the pad electrode PD through a contact hole further passing through the sub-base layer 110-S and the at least one inorganic layer 110-SL. The pad electrode PD may be disposed directly on an upper surface of the base layer 110.

Figure 7E:
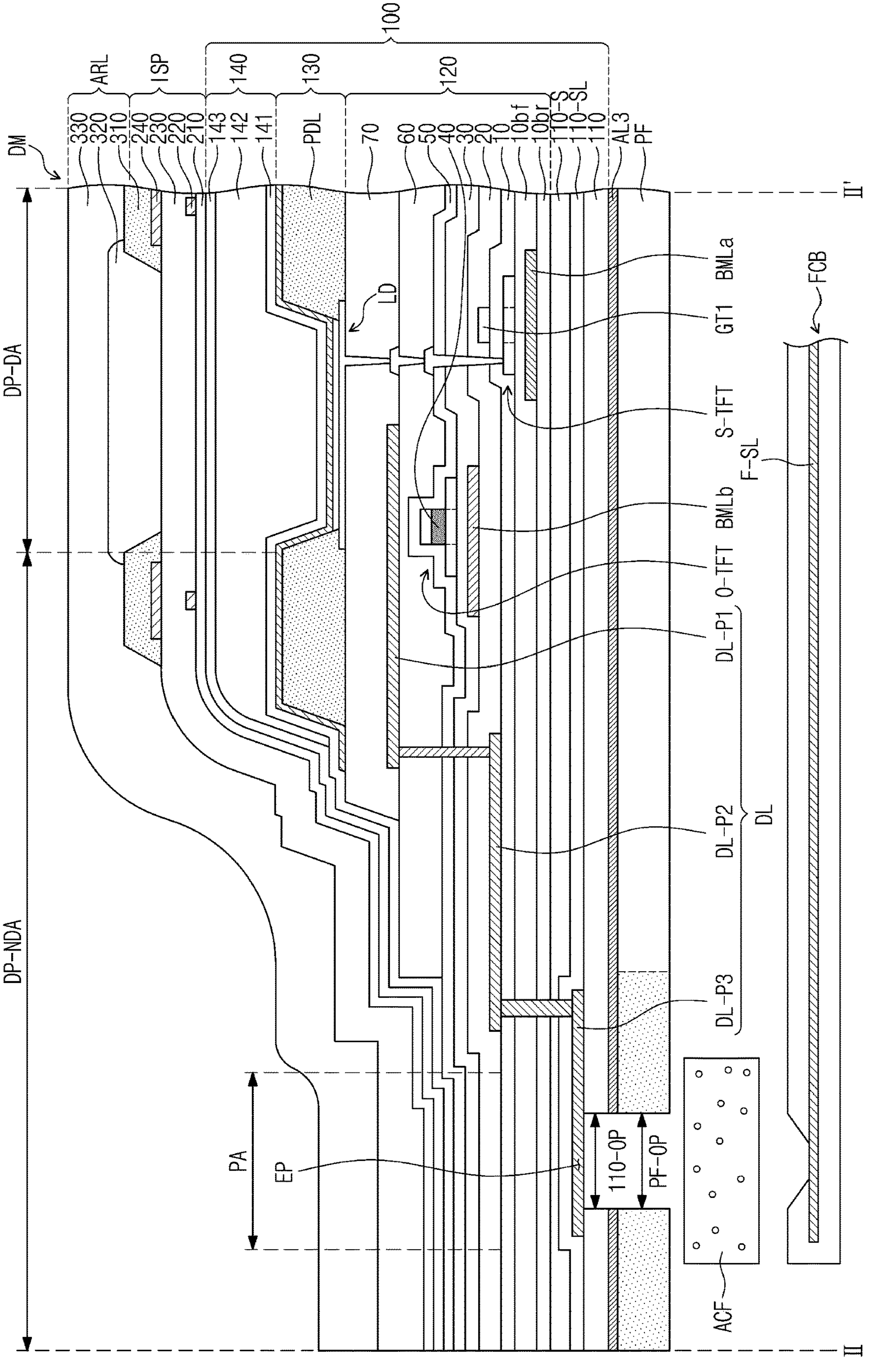
Figure 7F:
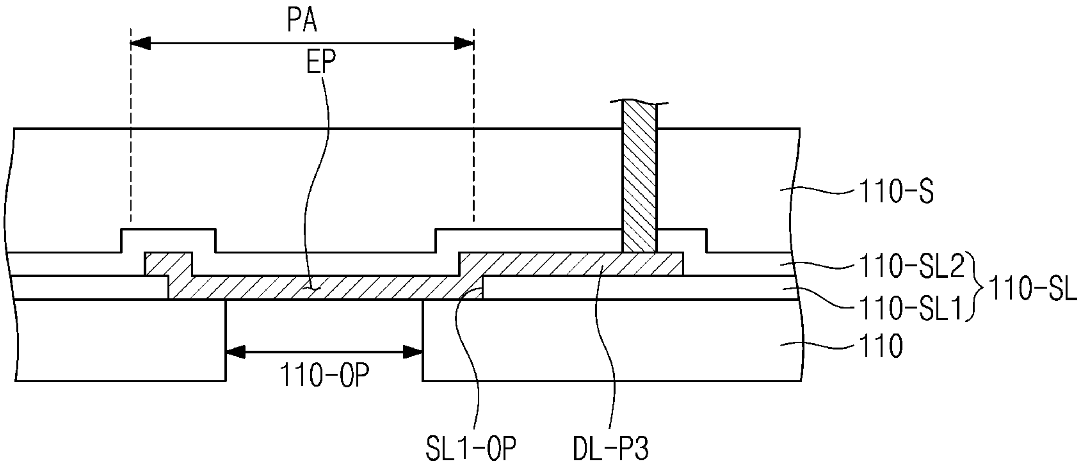
FIG. 7F is an enlarged view of FIG. 7E.
Figure 7G:
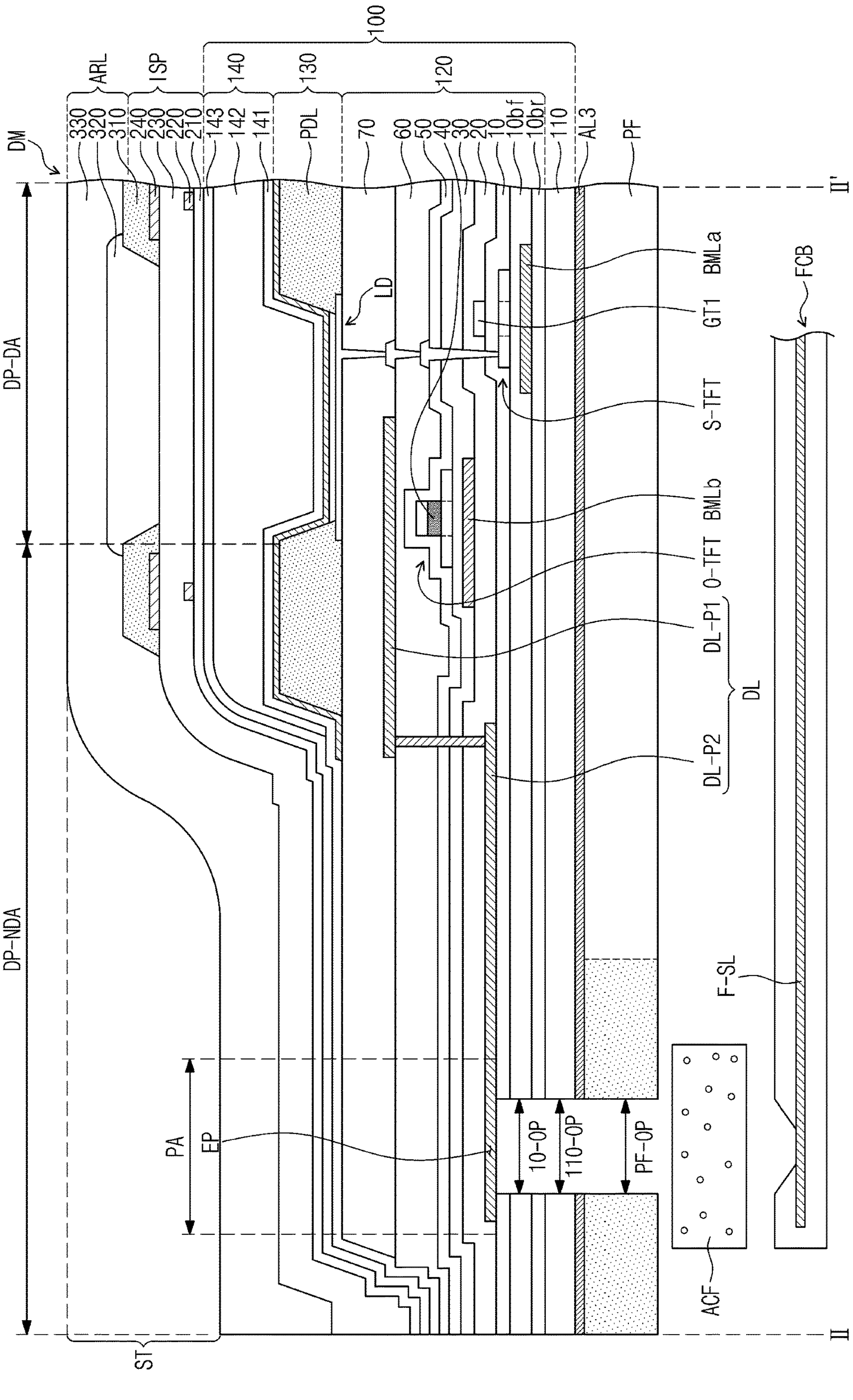
FIG. 7G is an enlarged cross-sectional view of the display module according to an embodiment of the invention.

Referring to FIG. 7E, the display panel DP may further include a sub-base layer 110-S and at least one inorganic layer 110-SL disposed between the sub-base layer 110-S and the base layer 110. As illustrated in FIG. 7E, the data line DL may include a first part DL-P1 disposed on the sixth insulating layer 60, a second part DL-P2 disposed on the first insulating layer 10, and a third part DL-P3 disposed between the sub-base layer 110-S and the base layer 110. An end portion EP of the third part DL-P3 may be defined as a pad portion of the data line DL which is exposed to outside the display module DM.

FIG. 7F is an enlarged view of the third part DL-P3 in FIG. 7E. The second open region 110-OP may be a region in which a sacrificial pattern has been disposed. The sacrificial pattern and the base layer 110 are formed on a carrier substrate. Thereafter, a first inorganic layer 110-SL1 having an opening portion SL1-OP defined therein is formed corresponding to the second open region 110-OP. A conductive layer is formed on the first inorganic layer 110-SL1 and then patterned to form the third part DL-P3. A portion disposed in the opening portion SL1-OP of the third part DL-P3 may be defined as the end portion EP. Thereafter, a second inorganic layer 110-SL2 and the sub-base layer 110-S are formed. After the display module DM in FIG. 7E is completed, the carrier substrate and the sacrificial pattern are removed in sequence. Accordingly, the pad region PA illustrated in FIG. 7F may be formed. The pad electrode PD illustrated in FIG. 7D may be also formed in a similar method to the third part DL-P3 described with reference to FIG. 7F.

Referring to FIG. 7G, the sixth insulating layer 60 and the seventh insulating layer 70, which are organic layers, may extend to overlap the pad region PA. In an embodiment of the invention, only one among the sixth insulating layer 60 and the seventh insulating layer 70 may extend to overlap the pad region PA.

The sixth insulating layer 60 and the seventh insulating layer 70, which overlap the pad region PA, may support the pad region PA during a bonding process in FIG. 8B, which will be described later. The sixth insulating layer 60 and the seventh insulating layer 70 overlap the pad region PA so that a stepped portion ST between the display region DP-DA and the non-display region DP-NDA, of the planarization layer 330, may be reduced. Accordingly, the display module DM may provide an upper film UF, which is coupled onto the planarization layer 330, with a more planarized surface for adhesion. The upper film UF, which is coupled to the display module DM in a more planarized state, may more stably support the pad region PA during the bonding process in FIG. 8B, which will be described later.

Figure 8A:
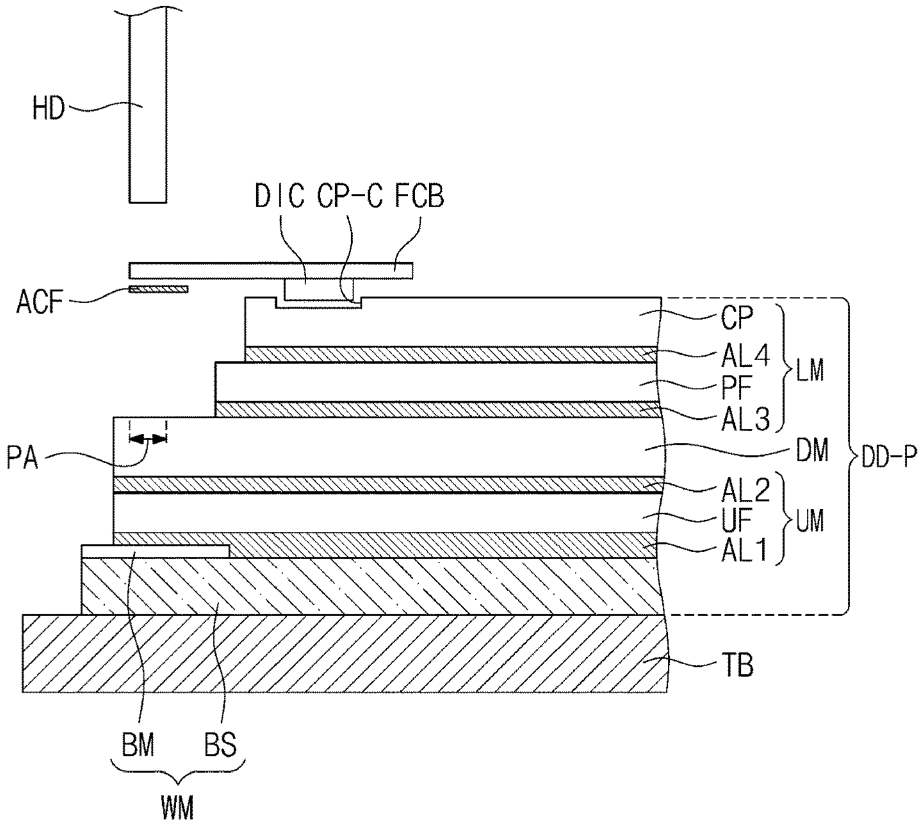
FIG. 8A to 8C are enlarged cross-sectional views illustrating a method for manufacturing a display device according to an embodiment of the invention.
Figure 8B:
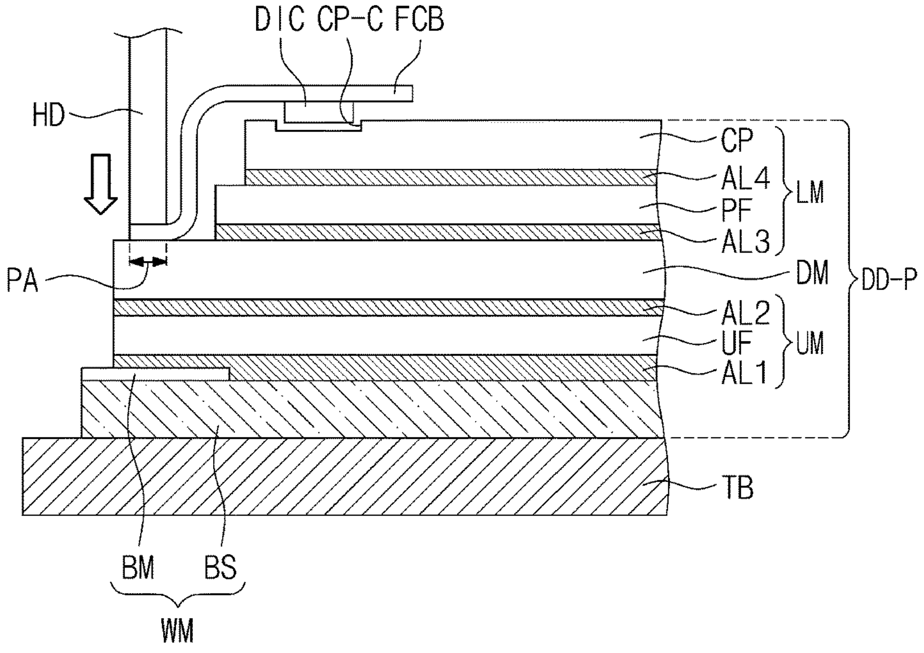
Figure 8C:
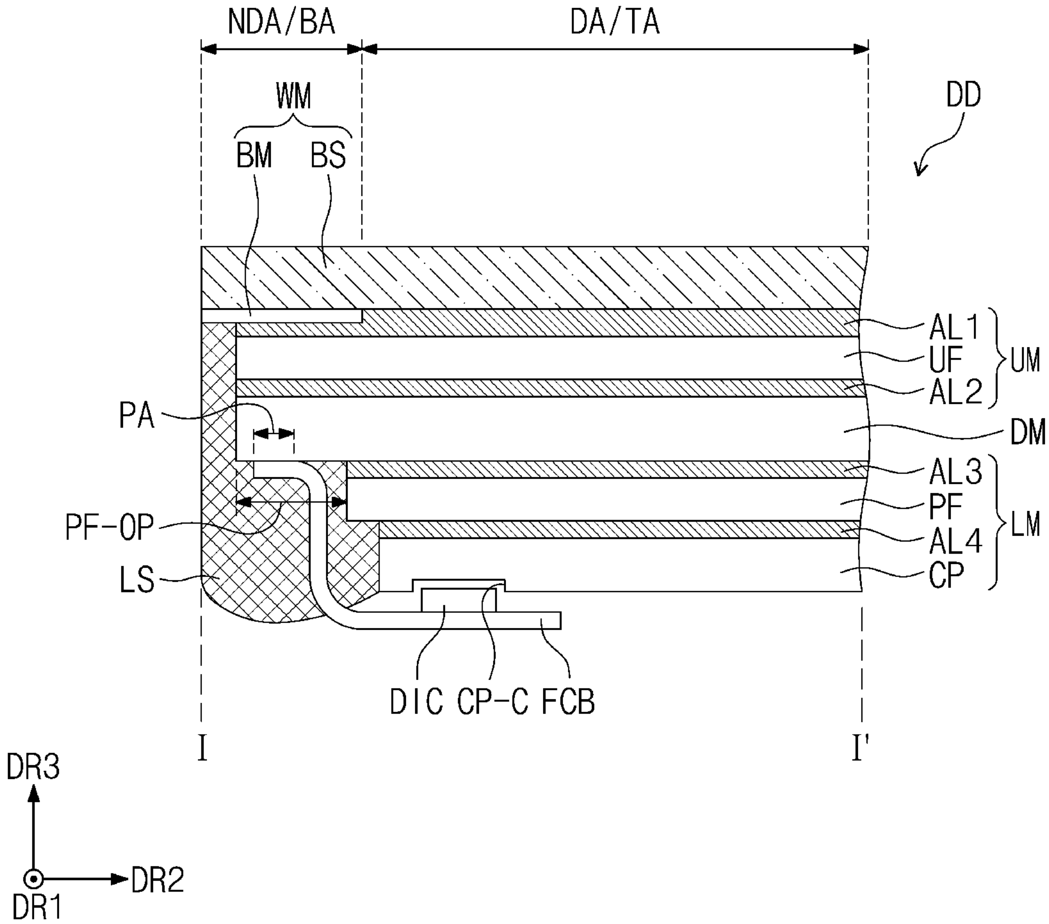

FIGS. 8A to 8C are side views illustrating a method for manufacturing (or providing) a display device DD according to an embodiment of the invention.

As illustrated in FIG. 8A, a preliminary display device DD-P, an anisotropic conductive film ACF, and a flexible circuit board FCB are provided. The preliminary display device DD-P is defined as a preliminary form of a display device DD in a state before the flexible circuit board FCB is bonded to a display module DM. The preliminary display device DD-P may include the window WM, the upper member UM, the display module DM, and the lower member LM.

In a state where the display module DM and the lower film PF are attached, the preliminary display device DD-P is separated from a mother substrate (not shown), where the mother substrate may include plural of the preliminary display device DD-P, without being limited thereto. The upper film UF and the window WM are attached, in sequence, to an upper side of the display module DM having the lower film PF attached thereto. Thereafter, the cover panel CP is attached to a lower side of the lower film PF, to provide the preliminary display device DD-P.

As illustrated in FIG. 8A, the preliminary display device DD-P is disposed on a work table TB so that the window WM is in contact with the work table TB. Thereafter, the anisotropic conductive film ACF and the flexible circuit board FCB are aligned with a pad region PA.

As illustrated in FIG. 8B, the flexible circuit board FCB and the anisotropic conductive film ACF are pressed using a bonding head HD. In a bonding process, the bonding head HD presses the pad region PA with the flexible circuit board FCB and the anisotropic conductive film ACF therebetween. Here, the upper film UF which faces the bonding head HD with the pad region PA therebetween, may support the pad region PA. Thus, the flexible circuit board FCB and the pad region PA may be electrically connected to each other by the anisotropic conductive film ACF. In FIG. 8B, the anisotropic conductive film ACF thinned in the bonding process is not illustrated for convenience of explanation.

The process for bonding the flexible circuit board FCB and the anisotropic conductive film ACF, to the display module DM, using the bonding head HD is described with reference to FIG. 8B. However, an embodiment of the invention is not limited thereto. Laser may be emitted from above the flexible circuit board FCB to bond the flexible circuit board FCB to the pad region PA. As the laser is emitted, a bump of the flexible circuit board FCB which is positioned corresponding to the pad region PA may be melted. Through a process for curing the melted bump, a pad of the flexible circuit board FCB and a pad portion (e.g., the end portion EP of the second part DL-P2) of a display panel DP may be bonded to each other. In addition, through an ultrasonic bonding process or the like, the process for bonding the flexible circuit board FCB and the anisotropic conductive film ACF to each other may be performed. In an embodiment, a bond between the flexible circuit board FCB and the display module DM may include a direct bond, without being limited thereto. The between the flexible circuit board FCB and the display module DM may define a bonding area having a planar area.

As illustrated in FIG. 8C, a resin structure LS may be formed relative to the display device DD having the flexible circuit board FCB bonded (e.g., electrically connected) to the display module DM. An insert-molding process may be used. The display device DD is disposed in a mold. A predetermined space is defined between an end surfaces of the display device DD (defined by end surfaces of various layers together with each other), and the mold. A resin is injected into the space and cured. The cured resin forms the resin structure LS.

Unlike what is illustrated in FIG. 8C, the resin structure LS may be disposed apart from at least one of the lower film PF or the cover panel CP. The resin may be applied around the pad region PA to protect the pad region PA. In addition, the resin structure LS illustrated with reference to FIG. 8C is aligned with a side surface of the window WM, but an embodiment of the invention is not limited thereto.

Figure 9:
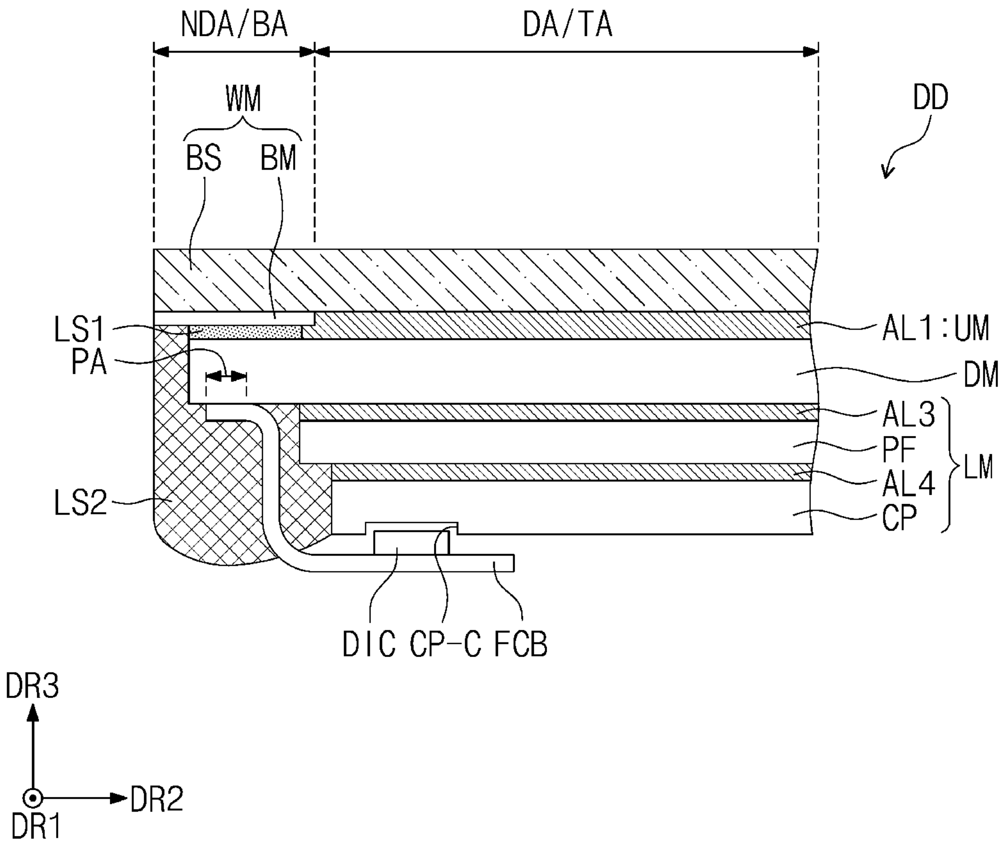
FIG. 9 is an enlarged cross-sectional view of an electronic device according to an embodiment of the invention.

FIG. 9 is a cross-sectional view of a display device DD according to an embodiment of the invention. FIG. 9 is a cross-sectional view corresponding to the view of FIG. 3. Hereinafter, the display device DD will be described focused on the difference from the display device DD described with reference to FIG. 3.

Referring to FIG. 9, an upper film UF and a second adhesive layer AL2 may be omitted in the display device DD according to this embodiment, when compared to the display device DD illustrated in FIG. 3. The detailed structure of a pad region PA may be the same as that described with reference to FIGS. 7A to 7G.

A first adhesive layer AL1 bonds a window WM to a display module DM. The first adhesive layer AL1 does not overlap the pad region PA. FIG. 9 illustrates an upper member UM including only the first adhesive layer AL1, but the upper member UM is not limited thereto. For example, the upper member UM may further include a polarizing film, and does not overlap the pad region PA regardless of any member included in the upper member UM.

As illustrated in FIG. 9, a first resin structure LS1 is disposed on the same layer as the first adhesive layer ALL As being disposed on a same layer, elements may be formed in a same process and/or as including a same material, elements may be in a same layer as each other as respective portions of a same material layer, may be on a same layer by forming an interface with a same underlying or overlying layer, etc., without being limited thereto. The first resin structure LS1 may be coplanar with the first adhesive layer AL1. The bezel pattern BM may be coplanar with the first adhesive layer AL1.

The first resin structure LS1 is disposed between the window WM and the display module DM to bond the window WM and the pad region PA of the display module DM, to each other. With respect to the pad region PA, the first resin structure LS1 serves as the upper film UF described with reference to FIGS. 3 and 8B. This will be described later in detail.

A second resin structure LS2 corresponds to the resin structure LS described with reference to FIGS. 3 and 8C. The second resin structure LS2 bonds a flexible circuit board FCB to the display module DM. The second resin structure LS2 may cover a side surface of the display module DM and a side surface of the cover panel CP.

FIGS. 10A to 10E are side views illustrating a method for manufacturing (or providing) a display device DD according to an embodiment of the invention.

Figure 10A:
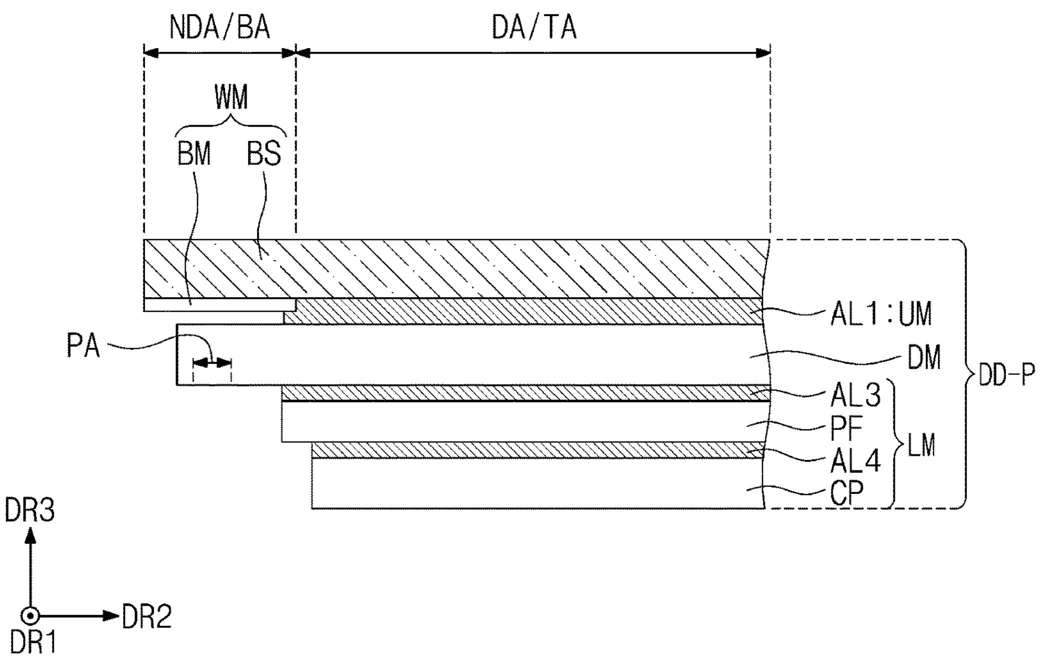
FIGS. 10A to 10E are enlarged cross-sectional views illustrating a method for manufacturing a display device according to an embodiment of the invention.

As illustrated in FIG. 10A, a preliminary display device DD-P is provided. The preliminary display device DD-P is defined as a preliminary form of a display device DD in a state before a flexible circuit board FCB is bonded. The preliminary display device DD-P may include the window WM, the upper member UM, the display module DM, and the lower member LM. FIG. 9 illustrates an upper member UM including only the first adhesive layer AL1, but the upper member UM is not limited thereto. Within the preliminary display device DD-P, a space at the pad region PA which is open to outside, is defined by the upper member UM, together with the window WM and the display module DM.

Figure 10B:
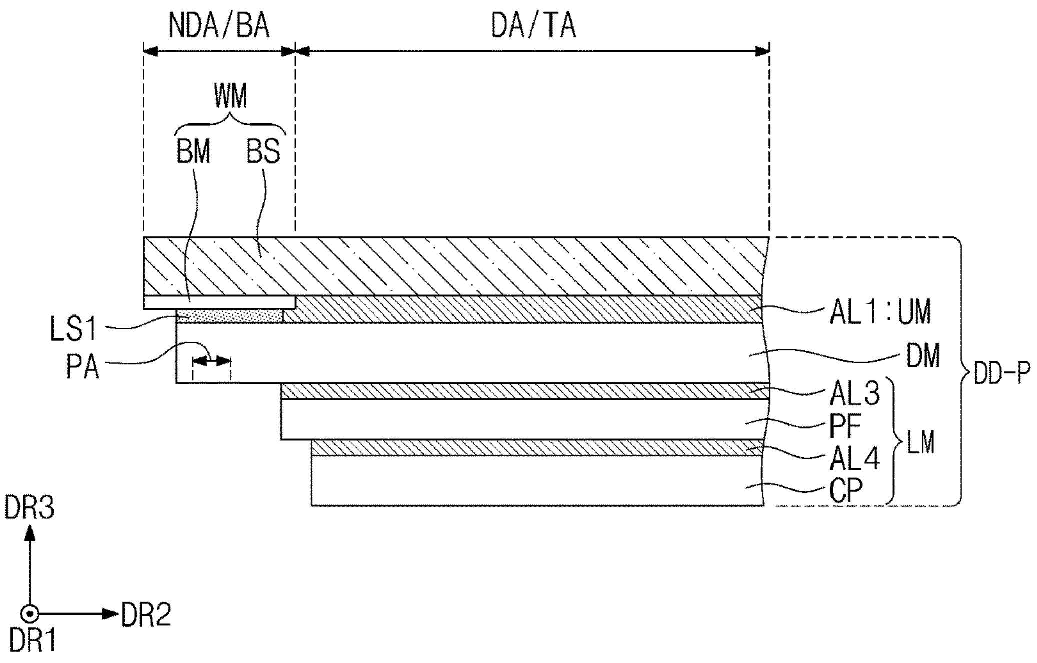

As illustrated in FIG. 10B, a first resin structure LS1 is formed (or provided). In this operation, an insert-molding process may be used. The preliminary display device DD-P is disposed in a mold. A space is defined between the mold and the preliminary display device DD-P. In particular, here, the space between the display module DM and the window WM described above, corresponds to the space (e.g., an enclosed spaced) between the mold and the preliminary display device DD-P. A resin material is injected into the space and cured. The cured resin forms the first resin structure LS1 between the window WM and the display module DM, at the pad region PA.

Figure 10C:
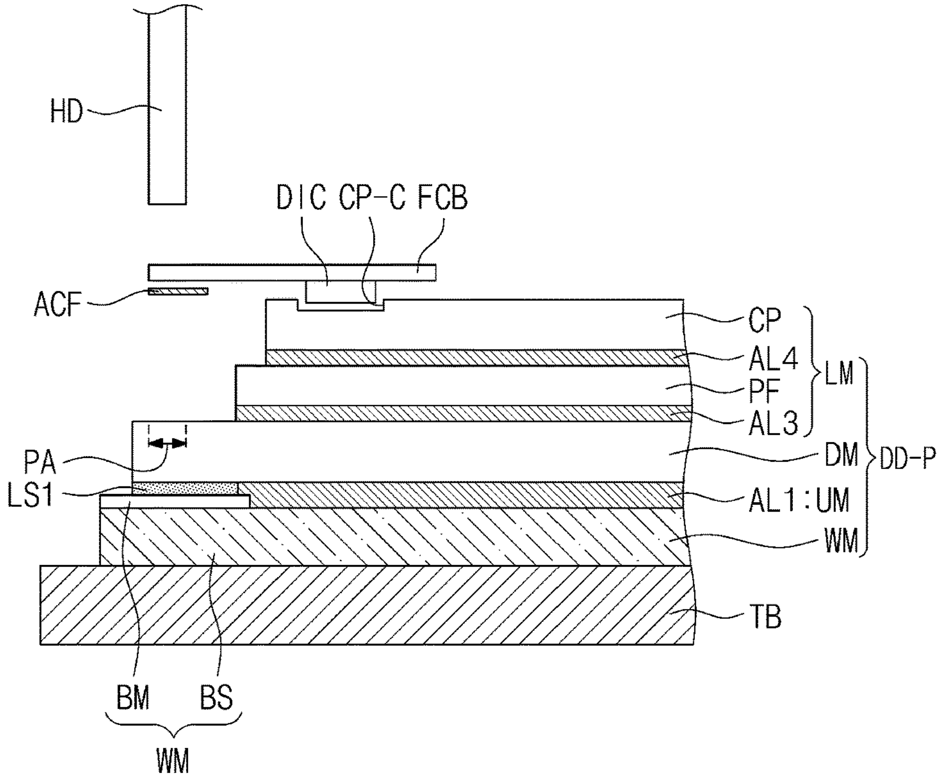

As illustrated in FIG. 10C, an anisotropic conductive film ACF and a flexible circuit board FCB are provided. The preliminary display device DD-P having the first resin structure LS1 formed therein is disposed on a work table TB so that the window WM is in contact with the work table TB. Thereafter, the anisotropic conductive film ACF and the flexible circuit board FCB are aligned with a pad region PA.

Figure 10D:
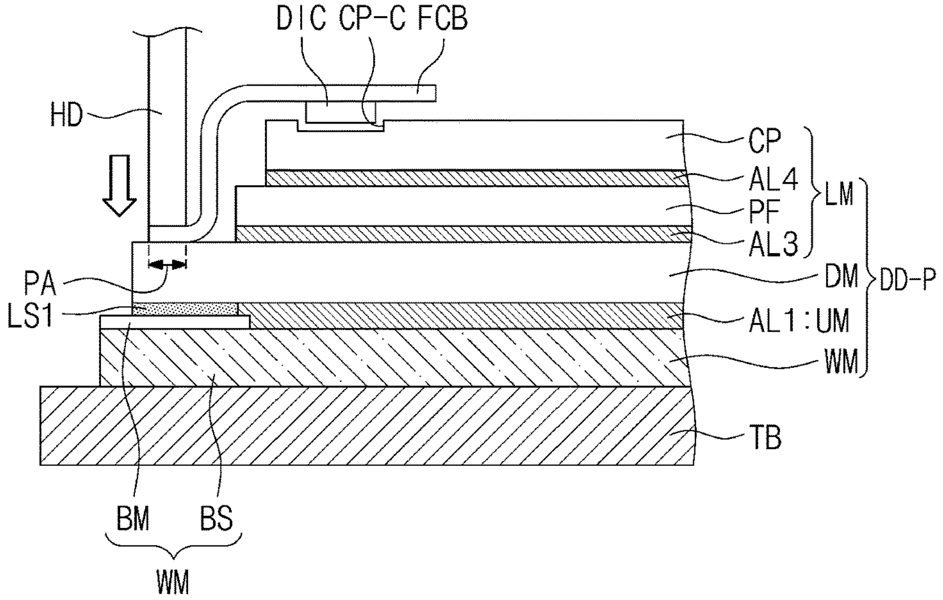

As illustrated in FIG. 10D, the flexible circuit board FCB and the anisotropic conductive film ACF are pressed to the display module DM, using a bonding head HD. In a bonding process, the bonding head HD presses the pad region PA with the flexible circuit board FCB and the anisotropic conductive film ACF therebetween. Here, the first resin structure LS1 may face the bonding head HD and support the pad region PA therebetween. Thus, the flexible circuit board FCB and the pad region PA may be electrically connected to each other, by the anisotropic conductive film ACF. The first resin structure LS1 facing the bonding head HD may have a greater strength than a supporting adhesive layer facing the bonding head HD (e.g., like the second adhesive layer AL2 in FIG. 8B) to sufficiently withstand a pressing force applied from the bonding head HD to the display module DM.

Figure 10E:
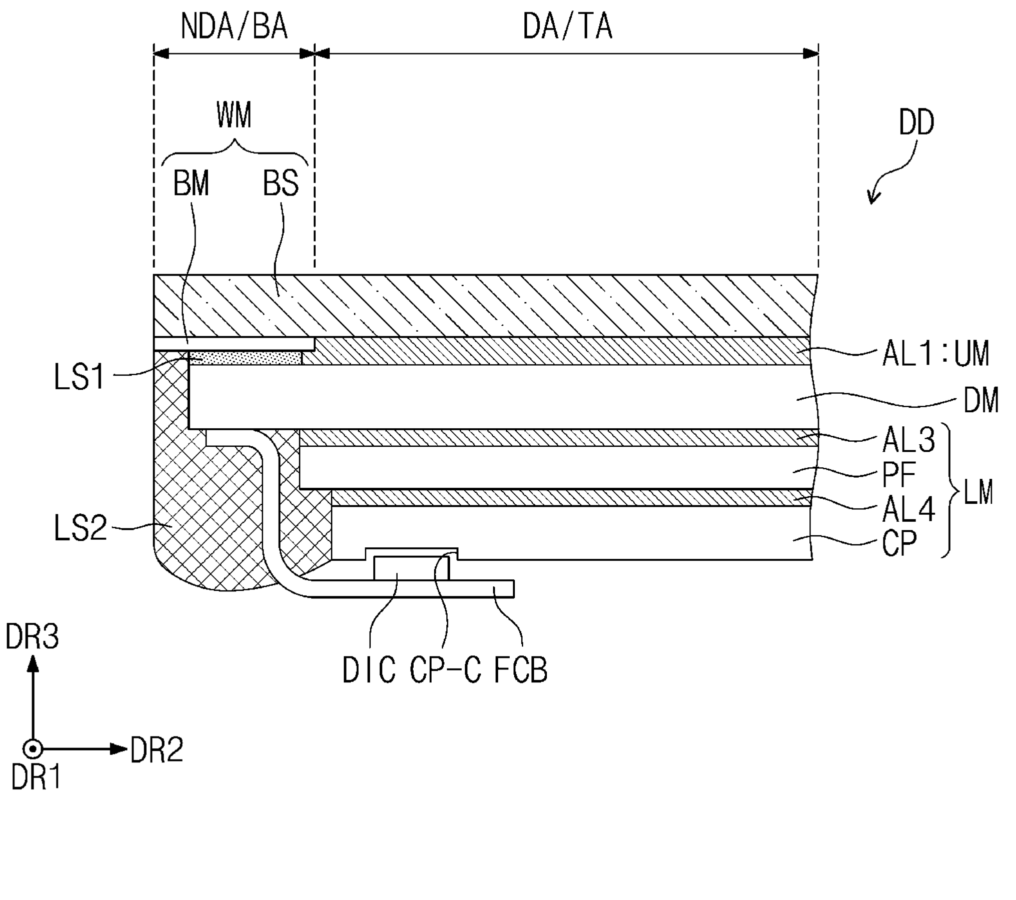

As illustrated in FIG. 10E, a second resin structure LS2 may be formed. In this operation, an insert-molding process may be used. The preliminary display device DD-P is disposed in a mold. A predetermined space is defined between end surfaces of the preliminary display device DD-P, and the mold. A resin is injected into the space and cured. The cured resin forms the second resin structure LS2. The display device DD includes both the first resin structure LS1 and the second resin structure LS2.

According to an embodiment of the invention, the flexible circuit board FCB is coupled onto the rear surface of the display panel DP. Since the non-display region DP-NDA of the display panel DP is not bent or deformed during coupling of the flexible circuit board FCB to the display module DM, a defect occurring in a bending region of the non-display region DP-NDA may be reduced or effectively prevented. In addition, since the non-display region DP-NDA of the display panel DP is not bent or deformed during coupling of the flexible circuit board FCB to the display module DM, the planar area of the bezel region BA of the window WM, for covering the non-display region DP-NDA of the display panel DP, may be reduced.

The upper film UF or the resin structure which corresponds to the pad region PA, supports the pad region PA of the display panel DP in the process for bonding the display panel DP and the flexible circuit board FCB to each other. Thus, the reliability of bonding the display panel DP and the flexible circuit board FCB may be improved.

The resin structure as the first resin structure LS1 or the second resin structure LS2 together with the first resin structure LS1, may fix the flexible circuit board FCB to the display module DM and protect the pad region PA of the display panel DP. The resin structure may block moisture from being penetrated into the pad region PA of the display panel DP, especially to layers of the display device DD (or electronic device ED) which have end surfaces exposed to outside.

Although the embodiments of the invention have been described, it is understood that the invention should not be limited to these embodiments but various changes and modifications can be made by one ordinary skilled in the art within the spirit and scope of the invention as hereinafter claimed. Therefore, the technical scope of the invention is not limited to the contents described in the detailed description of the specification, but should be determined by the claims.

What is claimed is:

1. A display device comprising:

a display module comprising:

a pad region, a base layer in which a first open region corresponding to the pad region is defined, a pixel on the base layer, and a signal line which is on the base layer and electrically connected to the pixel, the signal line including a pad portion corresponding to the first open region, a flexible circuit board electrically connected to the display module, at the pad region of the display module;

a window facing the display module;

an upper layer between the window and the display module;

a lower layer which faces the upper layer with the display module therebetween, the lower layer non-overlapping the pad region; and a resin structure which bonds the flexible circuit board to the display module, at the pad region, wherein each of the display module and the lower layer defines an end surface which is furthest from the pixel, and the resin structure contacts each of the display module and the lower layer, at the end surfaces thereof.

2. The display device of claim 1, wherein the pad portion of the signal line is exposed to outside the base layer, through the first open region defined in the base layer.

3. The display device of claim 1, wherein the display module further comprises a shield electrode, the pixel comprises:

a transistor including a semiconductor pattern and a gate, and a light emitting element electrically connected to the transistor, and the shield electrode is between the semiconductor pattern and the base layer.

4. The display device of claim 3, wherein the display module further comprises:

a pad electrode which is in a same layer as the shield electrode and between the pad portion and the base layer, and the pad electrode is electrically connected to the pad portion of the signal line and to the flexible circuit board, at the pad region.

5. The display device of claim 1, wherein the display module further comprises:

a sub-base layer between the signal line and the base layer, an inorganic layer between the sub-base layer and the base layer, and a pad electrode between the sub-base layer and the base layer, and the pad electrode is electrically connected to the pad portion of the signal line and to the flexible circuit board, at the pad region.

6. The display device of claim 1, wherein the display module further comprises:

a sub-base layer between the signal line and the base layer, and an inorganic layer between the sub-base layer and the base layer, and the pad portion of the signal line is disposed between the sub-base layer and the base layer.

7. The display device of claim 1, further comprising a lower layer which faces the upper layer with the display module therebetween, the lower layer non-overlapping the pad region, wherein a second open region corresponding to the pad region is defined in the lower layer, the second open region corresponds to the first open region in the base layer, and the pad portion of the signal line is exposed to outside the display module, through the first open region together with the second open region.

8. The display device of claim 1, wherein the upper layer defines an end surface which is furthest from the pixel, and the resin structure further contacts the upper layer at the end surface thereof.

9. The display device of claim 1, wherein the display module further comprises an input sensor on the base layer.

10. The display device of claim 9, wherein the display module further comprises an anti-reflection layer including a color filter corresponding to the pixel, on the input sensor.

11. A display device comprising:

a display module comprising:

a pad region, a base layer in which a first open region corresponding to the pad region is defined, a pixel on the base layer, and a signal line which is on the base layer and electrically connected to the pixel, the signal line including a pad portion corresponding to the first open region, a flexible circuit board electrically connected to the display module, at the pad region of the display module;

a window facing the display module;

an upper layer between the window and the display module; and a resin structure which bonds the flexible circuit board to the display module, at the pad region, wherein the pad portion of the signal line defines an end surface of the pad portion which is exposed to outside the display module, and the resin structure contacts the pad portion at the end surface thereof.

12. The display device of claim 1, further comprising:

a lower layer which faces the upper layer with the display module therebetween, the lower layer non-overlapping the pad region, a cover panel facing the display module with the lower layer therebetween, and in which a cavity is defined recessed from a lower surface of the cover panel, and a driving chip mounted on the flexible circuit board, wherein the flexible circuit board which is electrically connected to the display module at the pad region disposes the driving chip in the cavity of the cover panel.

13. A display device comprising:

a display module comprising:

a pad region, a base layer in which a first open region corresponding to the pad region is defined,
a pixel on the base layer, and
a signal line which is on the base layer and electrically connected to the pixel, the signal line including a pad portion corresponding to the first open region,
a flexible circuit board electrically connected to the display module, at the pad region of the display module;
a window facing the display module;
an upper layer which is between the window and the display module and bonds the window to the display module, the upper layer comprising:
a first resin structure overlapping the pad region, and
an adhesive layer which is non-overlapping with the pad region and coplanar with the first resin structure; and
a second resin structure which bonds the flexible circuit board to the display module, at the pad region.

14. The display device of claim 13, wherein
the pad portion of the signal line is exposed to outside the base layer, through the first open region defined in the base layer.

15. The display device of claim 13, further comprising a lower layer which faces the upper layer with the display module therebetween, the lower layer non-overlapping the pad region,
wherein
a second open region corresponding to the pad region is defined in the lower layer,
the second open region corresponds to the first open region in the base layer, and
the flexible circuit board is bonded to the pad region, through the second open region together with the first open region.

16. The display device of claim 13, further comprising a lower layer which faces the upper layer with the display module therebetween, the lower layer non-overlapping the pad region,
wherein
each of the display module and the lower layer defines an end surface which is furthest from the pixel, and
the second resin structure contacts each of the display module and the lower layer, at the end surfaces thereof.

17. The display device of claim 13, wherein
the pad portion of the signal line defines an end surface of the pad portion which is exposed to outside the display module, and
the second resin structure contacts the pad portion at the end surface thereof.

18. The display device of claim 13, wherein the display module further comprises:
a sub-base layer between the signal line and the base layer;
an inorganic layer between the sub-base layer and the base layer; and
a pad electrode between the sub-base layer and the base layer,
wherein the pad electrode is electrically connected to the pad portion of the signal line and to the flexible circuit board, at the pad region.

19. The display device of claim 13, wherein the display module further comprises:
a sub-base layer between the signal line and the base layer, and
an inorganic layer between the sub-base layer and the base layer, and
the pad portion of the signal line is disposed between the sub-base layer and the base layer.

* * * * *